(12) United States Patent
Lang et al.

(10) Patent No.: US 8,309,376 B2
(45) Date of Patent: Nov. 13, 2012

(54) PROCESS AND MATERIALS FOR MAKING CONTAINED LAYERS AND DEVICES MADE WITH SAME

(75) Inventors: Charles D. Lang, Goleta, CA (US); Paul Anthony Sant, Santa Barbara, CA (US); Jerald Feldman, Wilmington, DE (US); Steven Dale Ittel, Wilmington, DE (US); Stephan James McLain, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 288 days.

(21) Appl. No.: 12/738,460

(22) PCT Filed: Oct. 24, 2008

(86) PCT No.: PCT/US2008/081041
§ 371 (c)(1),
(2), (4) Date: Apr. 16, 2010

(87) PCT Pub. No.: WO2009/055628
PCT Pub. Date: Apr. 30, 2009

(65) Prior Publication Data
US 2010/0213454 A1     Aug. 26, 2010

Related U.S. Application Data

(60) Provisional application No. 60/982,927, filed on Oct. 26, 2007, provisional application No. 61/053,687, filed on May 16, 2008.

(51) Int. Cl.
*G03C 1/72* (2006.01)
*G03C 1/73* (2006.01)

(52) U.S. Cl. ............ 438/26; 438/29; 257/40; 430/495.1
(58) Field of Classification Search ................... None
See application file for complete search history.

(56) References Cited

U.S. PATENT DOCUMENTS 3,282,875 A      11/1966   Connolly et al.
(Continued)

FOREIGN PATENT DOCUMENTS

CN          1327360 A      12/2001
(Continued)

OTHER PUBLICATIONS

Kirk-Othmer Encyclopedia of Chemical Technology, Fourth Edition, vol. 18, p. 837-860, 1996, by Y. Wang.

(Continued)

*Primary Examiner* — Thomas L Dickey
*Assistant Examiner* — Joseph Schoenholtz

(57) ABSTRACT

There is provided a process for forming a contained second layer over a first layer. The process comprises forming the first layer having a first surface energy and then treating the first layer with a photocurable surface-active composition which is a fluorinated ester or fluorinated imide of an α,β-unsaturated polyacid; exposing the photocurable surface-active composition patternwise with radiation resulting in exposed areas and unexposed areas; developing the photocurable surface-active composition to remove the unexposed areas resulting in a first layer having untreated portions in the unexposed areas and treated portions in the exposed areas, where the treated portions have a second surface energy that is lower than the first surface energy; and forming the second layer on the untreated portions of the first layer. There is also provided an organic electronic device made by the process.

15 Claims, 2 Drawing Sheets

U.S. PATENT DOCUMENTS

| | | | |
|---|---|---|---|
| 4,003,312 | A | 1/1977 | Gunther |
| 4,358,545 | A | 11/1982 | Ezzell et al. |
| 4,430,403 | A | 2/1984 | Westdale et al. |
| 4,433,082 | A | 2/1984 | Grot et al. |
| 4,940,525 | A | 7/1990 | Ezzell |
| 5,392,980 | A | 2/1995 | Swamy et al. |
| 5,435,887 | A | 7/1995 | Rothschild et al. |
| 5,463,005 | A | 10/1995 | Desmarteau |
| 5,922,481 | A | 7/1999 | Etzbach et al. |
| 6,010,823 | A * | 1/2000 | Goto et al. ................. 430/280.1 |
| 6,087,196 | A | 7/2000 | Sturm et al. |
| 6,150,426 | A | 11/2000 | Curtin et al. |
| 6,228,559 | B1 | 5/2001 | Oda |
| 6,231,988 | B1 | 5/2001 | Kato |
| 6,303,238 | B1 | 10/2001 | Thompson et al. |
| 6,416,932 | B1 | 7/2002 | Ray et al. |
| 6,465,742 | B1 | 10/2002 | Hiraoka et al. |
| 6,479,612 | B1 | 11/2002 | Del Pesco et al. |
| 6,656,611 | B2 | 12/2003 | Tai et al. |
| 6,670,645 | B2 | 12/2003 | Grushin et al. |
| 6,736,985 | B1 | 5/2004 | Bao et al. |
| 6,753,380 | B2 | 6/2004 | Qiu |
| 6,992,326 | B1 | 1/2006 | MacPherson et al. |
| 7,098,060 | B2 | 8/2006 | Yu et al. |
| 7,138,551 | B2 | 11/2006 | Shtarov et al. |
| 7,190,113 | B2 | 3/2007 | Aoki |
| 7,431,866 | B2 | 10/2008 | Hsu et al. |
| 7,462,298 | B2 | 12/2008 | Hsu et al. |
| 7,572,651 | B2 | 8/2009 | Sirringhaus et al. |
| 8,124,172 | B2 | 2/2012 | Lang et al. |
| 2001/0019782 | A1 | 9/2001 | Igarashi et al. |
| 2001/0022497 | A1 | 9/2001 | Aoki et al. |
| 2001/0035714 | A1 | 11/2001 | Lu |
| 2002/0180347 | A1 | 12/2002 | Adachi et al. |
| 2003/0017360 | A1 | 1/2003 | Tai et al. |
| 2003/0129321 | A1 | 7/2003 | Aoki |
| 2003/0222250 | A1 | 12/2003 | Hsu |
| 2004/0029133 | A1 | 2/2004 | Herrnstadt |
| 2004/0075384 | A1 | 4/2004 | Aoki |
| 2004/0079940 | A1 | 4/2004 | Redecker et al. |
| 2004/0094768 | A1 | 5/2004 | Yu et al. |
| 2004/0102577 | A1 | 5/2004 | Hsu et al. |
| 2004/0127637 | A1 | 7/2004 | Hsu et al. |
| 2004/0155578 | A1 | 8/2004 | Ito et al. |
| 2004/0164293 | A1 | 8/2004 | Maloney et al. |
| 2004/0175646 | A1 | 9/2004 | Hatanaka et al. |
| 2004/0202863 | A1 | 10/2004 | Saito et al. |
| 2004/0222412 | A1 | 11/2004 | Bai et al. |
| 2004/0254297 | A1 | 12/2004 | Hsu et al. |
| 2005/0003202 | A1 | 1/2005 | Gerber |
| 2005/0003203 | A1 | 1/2005 | Brown |
| 2005/0026317 | A1 | 2/2005 | Sirringhaus et al. |
| 2005/0051770 | A1 | 3/2005 | Ando et al. |
| 2005/0062021 | A1 | 3/2005 | Petrov et al. |
| 2005/0196969 | A1 | 9/2005 | Gunner et al. |
| 2005/0205860 | A1 | 9/2005 | Hsu et al. |
| 2005/0227465 | A1 | 10/2005 | Smith et al. |
| 2005/0236614 | A1 | 10/2005 | Parker |
| 2005/0269550 | A1 | 12/2005 | Petrov et al. |
| 2006/0007520 | A1 | 1/2006 | Takakuwa et al. |
| 2006/0124061 | A1 | 6/2006 | Saito et al. |
| 2006/0275547 | A1 | 12/2006 | Lee et al. |
| 2007/0020395 | A1 | 1/2007 | Lang et al. |
| 2007/0075626 | A1 | 4/2007 | Yu et al. |
| 2007/0205409 | A1* | 9/2007 | Lecloux et al. ................. 257/40 |
| 2007/0218582 | A1* | 9/2007 | Lang et al. ................. 438/57 |
| 2007/0264155 | A1 | 11/2007 | Brady et al. |
| 2008/0087882 | A1 | 4/2008 | Lecloux et al. |
| 2008/0121846 | A1 | 5/2008 | Hsu et al. |
| 2008/0217644 | A1 | 9/2008 | Sorich |
| 2008/0220561 | A1 | 9/2008 | Karg et al. |
| 2009/0130296 | A1 | 5/2009 | Kwong et al. |
| 2010/0213454 | A1 | 8/2010 | Lang et al. |
| 2011/0092076 | A1 | 4/2011 | Lang et al. |

FOREIGN PATENT DOCUMENTS

| | | |
|---|---|---|
| DE | 3911934 A1 | 10/1990 |
| EP | 401439 A1 | 12/1990 |
| EP | 443861 A2 | 7/1995 |
| EP | 932081 A1 | 7/1999 |
| EP | 1128438 A1 | 8/2001 |
| EP | 1191612 A2 | 3/2002 |
| EP | 1191614 A2 | 3/2002 |
| EP | 1246011 A2 | 10/2002 |
| EP | 1411088 A1 | 4/2004 |
| EP | 1476000 A1 | 11/2004 |
| EP | 1560068 A1 | 8/2005 |
| EP | 1647566 A2 | 4/2006 |
| EP | 1026152 B1 | 7/2006 |
| EP | 1961775 A1 | 12/2006 |
| EP | 1992990 A1 | 3/2007 |
| EP | 1961775 A1 * | 8/2008 |
| JP | 54016203 A | 2/1979 |
| JP | 62271741 A | 11/1987 |
| JP | 63104683 A | 5/1988 |
| JP | 09203803 A | 8/1997 |
| JP | 2001237069 A | 8/2001 |
| JP | 2002164635 A | 6/2002 |
| JP | 2003123967 A | 4/2003 |
| JP | 2003209339 A | 7/2003 |
| JP | 2003297582 A | 10/2003 |
| JP | 2003309344 A | 10/2003 |
| JP | 2003338380 A | 11/2003 |
| JP | 2003344636 A | 12/2003 |
| JP | 2004047176 A | 2/2004 |
| JP | 2004071286 A | 3/2004 |
| JP | 2004177793 A | 6/2004 |
| JP | 2004199086 A | 7/2004 |
| JP | 2004234901 A | 8/2004 |
| JP | 2004355949 A | 12/2004 |
| JP | 2005093751 A | 4/2005 |
| JP | 2005166645 A | 6/2005 |
| JP | 2005223167 A | 8/2005 |
| JP | 2005232452 A | 9/2005 |
| JP | 2006049617 A | 2/2006 |
| WO | 9707986 A2 | 3/1997 |
| WO | 9831716 A1 | 7/1998 |
| WO | 9950069 A1 | 10/1999 |
| WO | 9952954 A1 | 10/1999 |
| WO | 00/70655 A2 | 11/2000 |
| WO | 01/41512 A1 | 6/2001 |
| WO | 0202714 A2 | 1/2002 |
| WO | 0215645 A1 | 2/2002 |
| WO | 03/008424 A1 | 1/2003 |
| WO | 03006537 A1 | 1/2003 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |
| WO | 2004042474 A1 | 5/2004 |
| WO | 2005000593 A1 | 1/2005 |
| WO | 2005031899 A1 | 4/2005 |
| WO | 2006043087 A1 | 4/2006 |
| WO | 2006070713 A1 | 7/2006 |
| WO | 2006072095 A2 | 7/2006 |
| WO | 2006117914 A1 | 11/2006 |
| WO | 2007/069703 A | 6/2007 |
| WO | WO 2007069703 A1 * | 6/2007 |
| WO | 2007/102487 A | 9/2007 |
| WO | WO 2007102487 A1 * | 9/2007 |
| WO | 2007145978 A1 | 12/2007 |

OTHER PUBLICATIONS

Gridnev and Ittel, "Catalytic Chain Transfer in Free-Radical Polymerizations," 10 Chem. Rev., 101(12), 3611-3659 (2001).

CRC Handbook of Chemistry an Physics, 81st Edition (2000-2001).

Cirkva, Radical additions to fluoroolefins. Photochemical fluoroalkylation of alkanols and alkane diols with perfluoro vinyl ethers; photo-supported 0-alkylation of butane-1,4-diol with hexafluoropropene, J. Fluorine Chemistry 80 (1996) 135-144.

Kurykin, J. Radiochemical addition of alcohols to perfluoro-2-alkenes Fluorine Chemistry 77 (1996) 193-194.

International Preliminary Report on Patentability, PCT/us2008/081041, PCT Counterpart of the Present Application, The International Bureau of WIPO, Geneva, CH, Athina Nickitas-Etienne, Authorized Officer, Apr. 27, 2010.

Appleby et al., "Polymeric Perfluoro Bis-Sulfonomides as Possible Fuel Cell Electrolytes," Journal of the Electrochemical Society, 1993, vol. 140, pp. 109-111.

Braun et al., "Visible Light Emission from Semiconducting Polymer Diodes," Applied Physics Letters, 1991, vol. 58, pp. 1982-1984.

Burns et al., "Printing of Polymer Thin-Film Transistors for Active-Matrix Display Applications," Journal of the Society for Information Display, 2003, vol. 11, No. 4, pp. 599-604.

Campbell, I.H. et al., "Excitation Transfer Processes in a Phosphor-Doped Poly 9p-phenylene vinylene) Light-Emitting Diode," Physical Review B., vol. 65, 085210-1-085210-8.

Desmarteau, Novel Perfluoinated Ionomers and Ionenes, Journal of Fluorine Chemistry, 1995, vol. 72, pp. 203-208.

Djurovich et al., "Ir(III) Cyclometalated Complexes as Efficient Phosphorescent Emitters in Polymer Blend and Organic LEDs," Polymer Preprints, 2000, 41(1), pp. 770-771.

Feiring et al., "Aromatic Monomers with Pendant Fluoroalkylsulfonate and Sulfonimide Groups," Journal of Fluorine Chemistry, 2000, vol. 105, pp. 129-135.

Feiring et al., "Novel Aromatic Polymers with Pendant Lithium Perfluoroalkylsulfonate or Sulfinimide Groups," Macromolecules, 2000, vol. 33, pp. 9262-9271.

Fluegel: Statistical Calculation and Development of Glass Properties; Measurement of the Glass Transition Temperature Tg, Alexander Fluegel http://glassproperties.com/tg/; Retrieved from Internet on May 3, 2011.

Gustafsson et al., Flexible Light-Emitting Diodes Made from Soluble Conducting Polymers, Nature, 1992 vol. 357, pp. 477-479.

Lee et al., Poly(thieno(3,4-b)thiophene) A New Stable Low Band Gap Conducting Polymer, Macromolecules, 2001, vol. 34, pp. 5746-5747.

O'Brien, D.F. et al., "Electrophosphorescence From a Doped Polymer Light Emitting Diode," Synthetic Metals, 2001, 116(1-3), 379-383.

Sigma-Aldrich Thermal Transition of Homopolymers; http://www.sigmaaldrich.com/etc/medialib/docs/Aldrich/General__Information/thermal_transitions_of_homopolymers.Par.0001.File.tmp/thermal_transitions_of_homopolymers.pdf.

Sotzing et al., "Poly(thieno(3,4-b)thiophene): a p- and n-Dopable Polythiophene Exhibiting High Optical Transparency in the Semiconducting State," Macromolecules, 2002, vol. 35, pp. 7281-7286.

Sugimura et al., "Micropatterning of Alkyl- and Fluoroalkylsilane Self-Assembled Monolayers Using Vacuum Ultra-Violet Light," Langmuir, 2000, vol. 16, No. 3, pp. 885-888.

Wu et al., "Transparent, Conductive Carbon Nanotube Films," Science, 2004, vol. 305, pp. 1273-1276.

Extended European Search Report for Application No. EP06749552.3, counterpart to U.S. Appl. No. 11/401,151; Apr. 18, 2011.

Extended European Search Report for Application No. EP07755188.5, counterpart to U.S. Appl. No. 11/444,655; Mar. 21, 2012.

International Search Report for Application No. PCT/US2006/013118, counterpart to U.S. Appl. No. 11/401,151; May 28, 2008.

International Search Report for Application No. PCT/US2007/008830, counterpart to U.S. Appl. No. 11/444,655; ISA/US; Mar. 18, 2008.

International Search Report for Application No. PCT/US2007/01328, counterpart to U.S. Appl. No. 11/758,283; EPO; Nov. 26, 2007.

International Search Report for Application No. PCT/US2007/013286, counterpart to U.S. Appl. No. 11/758,269; EPO; Nov. 22, 2007.

International Search Report for Application No. PCT/US2007/013583, counterpart to U.S. Appl. No. 11/759,286; EPO; Feb. 27, 2007.

International Search Report for Application No. PCT/US2008/063825, counterpart to U.S. Appl. No. 12/121,234; EPO; Oct. 31, 2008.

International Search Report for Application No. PCT/US2008/081041, counterpart to U.S. Appl. No. 12/738,460; EPO; May 2009.

International Search Report for Application No. PCT/US2009/044502, counterpart to U.S. Appl. No. 12/993,202; KIPO; Dec. 23, 2009.

* cited by examiner

PROCESS AND MATERIALS FOR MAKING CONTAINED LAYERS AND DEVICES MADE WITH SAME

RELATED APPLICATION DATA

This application claims priority under 35 U.S.C. §119(e) from U.S. Provisional Application No. 60/982,927 filed on Oct. 26, 2007, and from Provisional Application No. 61/053,687 filed on May 16, 2008, both of which are incorporated by reference herein in their entirety.

BACKGROUND INFORMATION

1. Field of the Disclosure

This disclosure relates in general to a process for making an electronic device. It further relates to the device made by the process.

2. Description of the Related Art

Electronic devices utilizing organic active materials are present in many different kinds of electronic equipment. In such devices, an organic active layer is sandwiched between two electrodes.

One type of electronic device is an organic light emitting diode (OLED). OLEDs are promising for display applications due to their high power-conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

Current research in the production of full-color OLEDs is directed toward the development of cost effective, high throughput processes for producing color pixels. For the manufacture of monochromatic displays by liquid processing, spin-coating processes have been widely adopted (see, e.g., David Braun and Alan J. Heeger, Appl. Phys. Letters 58, 1982 (1991)). However, manufacture of full-color displays requires certain modifications to procedures used in manufacture of monochromatic displays. For example, to make a display with full-color images, each display pixel is divided into three subpixels, each emitting one of the three primary display colors, red, green, and blue. This division of full-color pixels into three subpixels has resulted in a need to modify current processes to prevent the spreading of the liquid colored materials (i.e., inks) and color mixing.

Several methods for providing ink containment are described in the literature. These are based on containment structures, surface tension discontinuities, and combinations of both. Containment structures are geometric obstacles to spreading: pixel wells, banks, etc. In order to be effective these structures must be large, comparable to the wet thickness of the deposited materials. When the emissive ink is printed into these structures it wets onto the structure surface, so thickness uniformity is reduced near the structure. Therefore the structure must be moved outside the emissive "pixel" region so the non-uniformities are not visible in operation. Due to limited space on the display (especially high-resolution displays) this reduces the available emissive area of the pixel. Practical containment structures generally have a negative impact on quality when depositing continuous layers of the charge injection and transport layers. Consequently, all the layers must be printed.

In addition, surface tension discontinuities are obtained when there are either printed or vapor deposited regions of low surface tension materials. These low surface tension materials generally must be applied before printing or coating the first organic active layer in the pixel area. Generally the use of these treatments impacts the quality when coating continuous non-emissive layers, so all the layers must be printed.

An example of a combination of two ink containment techniques is $CF_4$-plasma treatment of photoresist bank structures (pixel wells, channels). Generally, all of the active layers must be printed in the pixel areas.

All these containment methods have the drawback of precluding continuous coating. Continuous coating of one or more layers is desirable as it can result in higher yields and lower equipment cost. There exists, therefore, a need for improved processes for forming electronic devices.

SUMMARY

There is provided a process for forming a contained second layer over a first layer, said process comprising:

forming the first layer having a first surface energy;

treating the first layer with a photocurable surface-active composition comprising a material selected from the group consisting of a fluorinated ester of an $\alpha,\beta$-unsaturated polyacid, a fluorinated imide of an $\alpha,\beta$-unsaturated polyacid, and combinations thereof;

exposing the photocurable surface-active composition patternwise with radiation resulting in exposed areas and unexposed areas;

developing the photocurable surface-active composition to remove the photocurable surface-active composition from the unexposed areas resulting in a first layer having untreated portions in the unexposed areas and treated portions in the exposed areas, wherein the treated portions have a second surface energy that is lower than the first surface energy; and forming the second layer on the untreated portions of the first layer.

There is provided a process for making an organic electronic device comprising a first organic active layer and a second organic active layer positioned over an electrode, said process comprising:

forming the first organic layer having a first surface energy over the electrode treating the first organic layer with a photocurable surface-active composition comprising a material selected from the group consisting of a fluorinated ester of an $\alpha,\beta$-unsaturated polyacid, a fluorinated imide of an $\alpha,\beta$-unsaturated polyacid, and combinations thereof;

exposing the photocurable surface-active composition patternwise with radiation resulting in exposed areas and unexposed areas;

developing the photocurable surface-active composition to remove the photocurable surface-active composition from the unexposed areas resulting in a first organic active layer having untreated portions in the unexposed areas and treated portions in the exposed areas, wherein the treated portions have a second surface energy that is lower than the first surface energy; and forming the second organic layer on the untreated portions of the first organic active layer.

There is also provided an organic electronic device comprising a first organic active layer and a second organic active layer positioned over an electrode, and further comprising a patterned photocured surface-active composition, wherein said second organic active layer is present only in areas where the photocured surface-active composition is not present, wherein said photocured surface-active composition is made from a material selected from the group consisting of a fluorinated ester of an α,β-unsaturated polyacid, a fluorinated imide of an α,β-unsaturated polyacid, and combinations thereof.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
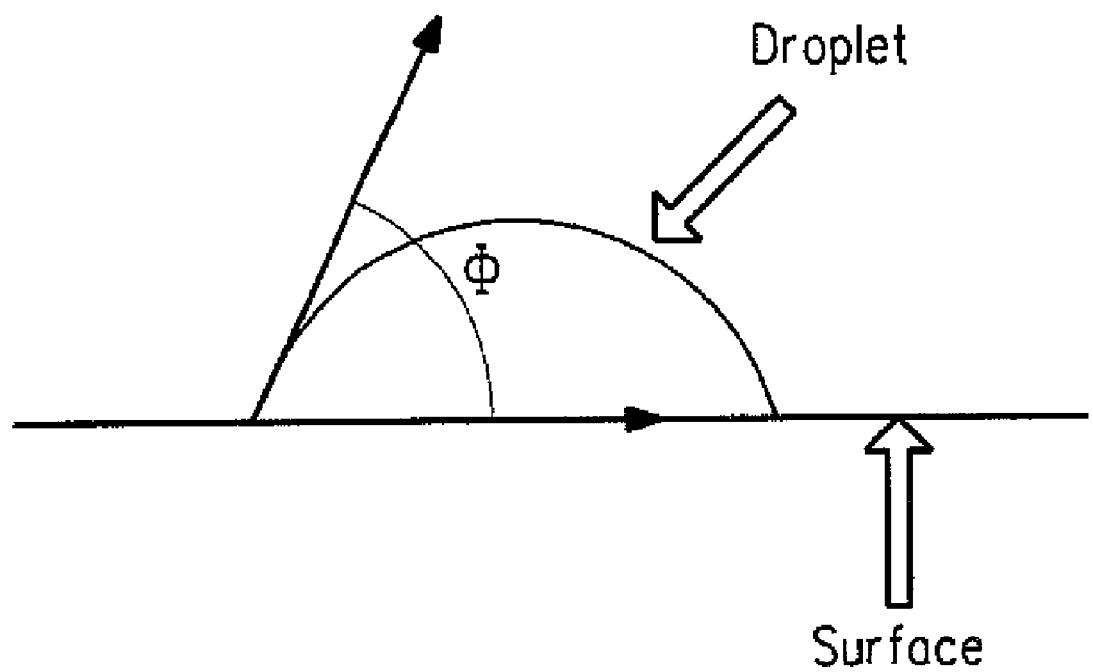
FIG. 1 includes a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a process for forming a contained second layer over a first layer, said process comprising:
  forming the first layer having a first surface energy;
  treating the first layer with a photocurable surface-active composition comprising a material selected from the group consisting of a fluorinated ester of an α,β-unsaturated polyacid, a fluorinated imide of an α,β-unsaturated polyacid, and combinations thereof;
  exposing the photocurable surface-active composition patternwise with radiation resulting in exposed areas and unexposed areas;
  developing the photocurable surface-active composition to remove the photocurable surface-active composition from the unexposed areas resulting in a first layer having untreated portions in the unexposed areas and treated portions in the exposed areas, wherein the treated portions have a second surface energy that is lower than the first surface energy; and
  forming the second layer on the untreated portions of the first layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims.

The detailed description first addresses Definitions and Clarification of Terms followed by the Photocurable Surface-Active Composition, the Process, the Organic Electronic Device, and finally Examples.

1. Definitions and Clarification of Terms

Before addressing details of embodiments described below, some terms are defined or clarified.

The term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "contained" when referring to a layer, is intended to mean that as the layer is printed, it does not spread significantly beyond the area where it is deposited despite a natural tendency to do so were it not contained. The layer can be contained by surface energy effects or a combination of surface energy effects and physical barrier structures.

The term "electrode" is intended to mean a member or structure configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "fluorinated" when referring to an organic compound, is intended to mean that one or more of the hydrogen atoms in the compound have been replaced by fluorine. The term encompasses partially and fully fluorinated materials.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. A layer may be highly patterned or may be overall and unpatterned.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid containment structure" is intended to mean a structure within or on a workpiece, wherein such one or more structures, by itself or collectively, serve a principal function of constraining or guiding a liquid within an area or region as it flows over the workpiece. A liquid containment structure can include cathode separators or a well structure.

The term "liquid medium" is intended to mean a liquid material, including a pure liquid, a combination of liquids, a solution, a dispersion, a suspension, and an emulsion. Liquid medium is used regardless whether one or more solvents are present.

The term "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "photocurable" is intended to refer to a radiation-sensitive composition or layer which becomes better adhered to a surface or more difficult to remove from a surface when exposed to radiation.

The term "photocurable surface-active composition" is intended to mean a composition that comprises at least one photocurable material, and when the composition is applied to a layer, the surface energy of that layer is reduced. The term is abbreviated "PCSA", and refers to the composition both before and after exposure to radiation.

The term "photocured surface-active composition" refers to the photocurable surface-active composition after it has been formed into a layer and exposed to radiation.

The term "polyacid" is intended to mean an organic compound having two or more acid groups.

The term(s) "radiating/radiation" means adding energy in any form, including heat in any form, the entire electromagnetic spectrum, or subatomic particles, regardless of whether such radiation is in the form of rays, waves, or particles.

The term "radiation-sensitive" when referring to a material, is intended to mean that exposure to radiation results in a change of at least one chemical, physical, or electrical property of the material.

The term "surface energy" is the energy required to create a unit area of a surface from a material. A characteristic of surface energy is that liquid materials with a given surface energy will not wet surfaces with a sufficiently lower surface energy.

The term "unsaturated" as it refers to an organic compound, is intended to mean that the compound has at least one carbon-carbon double bond or carbon-carbon triple bond. The term "α,β-unsaturated" is intended to mean that the double or triple bond is in conjugation with an acid functional group.

As used herein, the term "over" does not necessarily mean that a layer, member, or structure is immediately next to or in contact with another layer, member, or structure. There may be additional, intervening layers, members or structures.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Photocurable Surface-Active Composition

The photocurable surface-active composition ("PCSA") is a radiation-sensitive composition. When exposed to radiation, the PCSA reacts to form a material that is better adhered to a surface or more difficult to remove from a surface than the material not exposed to radiation. Treatment with the PCSA lowers the surface energy of the material being treated.

The radiation can be any type of radiation to which results in the desired physical change in the PCSA. In one embodiment, the radiation is selected from infrared radiation, visible radiation, ultraviolet radiation, and combinations thereof. In one embodiment, the radiation is selected from visible radiation and ultraviolet radiation. In one embodiment, the radiation has a wavelength in the range of 300 to 450 nm. In one embodiment, the radiation is deep UV radiation, having a wavelength in the range of 200-300 nm. In another embodiment, the ultraviolet radiation is of somewhat longer wavelength, in the range 300-400 nm. In another embodiment, the radiation has a wavelength in the range of 400 to 450 nm.

In some embodiments, the PCSA can be applied from solvents or by vapor deposition. In some embodiments, the PCSA has a vapor pressure which is sufficiently low to prevent unwanted evaporation after it is applied to form the treated first layer. In some embodiments, the PCSA does not react in the absence of radiation to form undevelopable species.

The PCSA comprises a fluorinated ester or imide of an α,β-unsaturated polyacid. The acid groups can be selected from the group consisting of carboxylic acid, sulfonic acid, phosphoric acid, and combinations thereof. In some embodiments, the polyacid is a polycarboxylic acid.

In some embodiments, the polyacid is linear. In some embodiments, the polyacid is branched. In some embodiments, the polyacid may contain more than one unsaturated unit. In some embodiments, the polyacid is substituted. In some embodiments, this substitution incorporates one or more oxygen atoms into the hydrocarbon backbone of the unsaturated polyacid. In some embodiments, this substitution is pendant to the hydrocarbon backbone of the unsaturated polyacid. In some embodiments, this substitution contains fluorine atoms. In some embodiments, all of the acid groups are in conjugation with the unsaturated group or groups. In some embodiments, only one of the acid groups is in conjugation with an unsaturated group.

In some embodiments, the PCSA is at least 50% fluorinated, by which is meant that 50% of the available hydrogen atoms bonded to carbon have been replaced by fluorine. In some embodiments, the PCSA is at least 60% fluorinated; in some embodiments, at least 70% fluorinated. In some embodiments, the PCSA is an ester or imide of an α,β-unsaturated, polyacid which is not aromatic. Examples of non-aromatic α,β-unsaturated polyacids include, but are not limited to, fumaric, maleic, itaconic, 2,2-dimethyl-4-methylenepentanedioic acid, muconic, 2-methyleneglutaric, aconitic, acetylenedicarboxylic, and hex-2-en-4-yne dioic acids, and oligomers of methacrylic acid. The PCSA may comprise one or more fluorinated esters or imides of unsaturated polyacids or fluorinated esters or imides of unsaturated polyacids in combination with fluorinated unsaturated monoacids.

In some embodiments, the ester is formed using a fluorinated alcohol, $R_fOH$. The $R_f$ group has 4-15 carbon atoms, 0-5 oxo oxygen atoms contained within the carbon atom chain, and at least 4 fluorine atoms, with the proviso that there is no fluorine atom on the carbon atom bearing OH. The fluorinated alcohol may be linear or branched, saturated or unsaturated. In some embodiments the alcohol has one of the formulas below:

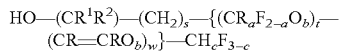

or

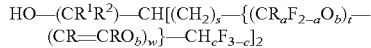

where a, b, c, p, s, t, and w are the same or different at each occurrence and are integers, and
a=0-2,
b=0-1,
c=0-3,
R=H or $(CH_aF_{2-a})_pF$,
$R^1$, $R^2$=H or $C_pH_{2p+1}$,
p=1-3,
s=0-5,
t=2-15, and
w=0-2.

The groups within the brackets { } can be arranged in any order. In some embodiments, $1 \leq s \leq 4$. In some embodiments, s=2 or 3. In some embodiments, $4 \leq t+w \leq 12$. In some embodiments, c=0. In some embodiments, w=0 or 1. In some embodiments, a=0. In some embodiments, R=H or $CF_3$. In some embodiments, $R^1=R^2=H$. In some embodiments, $R^1=R^2=CH_3$.

Some non-limiting examples of fluorinated alcohols include:

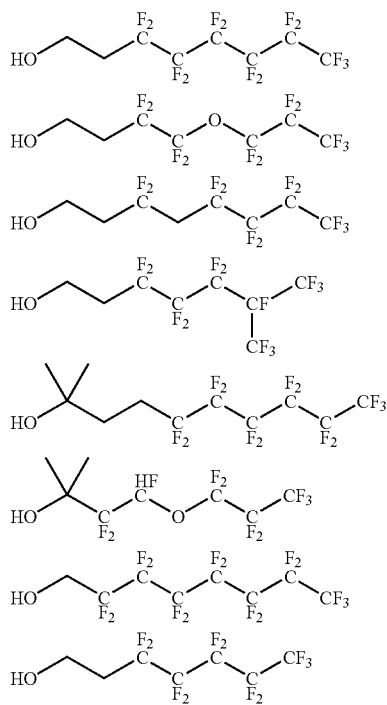

In some embodiments, the amide is formed using a fluorinated amine, $R_fNH_2$. The $R_f$ group has 4-15 carbon atoms, 0-5 oxo oxygen atoms contained within the carbon atom chain, and at least 4 fluorine atoms, with the proviso that there is no fluorine atom on the carbon atom bearing $NH_2$. The fluorinated amine may be linear or branched, saturated or unsaturated.

In some embodiments the amine has one of the formulas below:

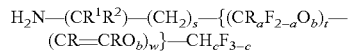

or

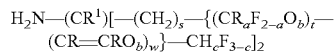

where a, b, c, s, t, and w are the same or different at each occurrence and are integers, and
a=0-2,
b=0-1,
c=0-3,
R=H or $(CH_aF_{2-a})_pF$,
$R^1$, $R^2$=H or $C_pH_{2p+1}$,
p=1-3,
s=0-5,
t=2-15, and w=0-2.

The groups within the brackets { } can be arranged in any order. In some embodiments, $1 \leq s \leq 4$. In some embodiments, s=2 or 3. In some embodiments, $4 \leq t+w \leq 12$. In some embodiments, c=0. In some embodiments, w=0 or 1. In some embodiments, a=0. In some embodiments, R=H or $CF_3$. In some embodiments, $R^1=R^2=H$. In some embodiments, $R^1=R^2=CH_3$.

Some non-limiting examples of amines include:

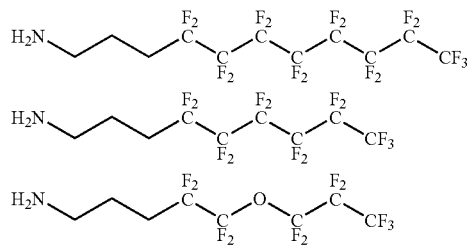

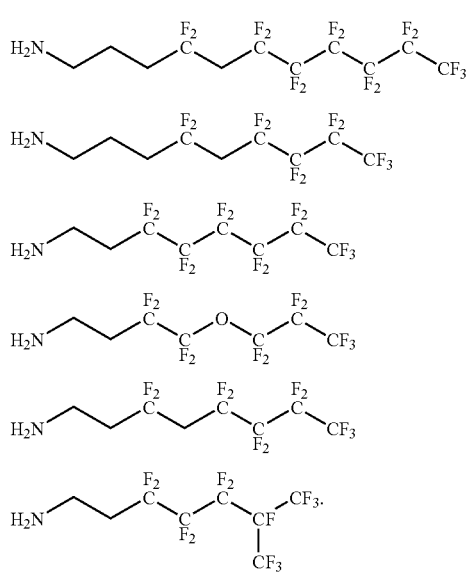

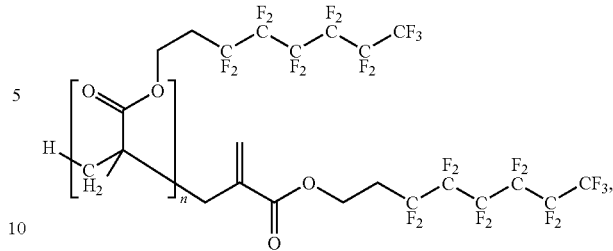

Additional examples of fluorinated alcohols and amines can be found in, for example, J. Fluorine Chemistry 77 (1996) 193-194; J. Fluorine Chemistry 80 (1996) 135-144; and U.S. Pat. Nos. 6,479,612 and 7,138,551.

When the PCSA is an ester, all of the acid groups of the α,β-unsaturated polyacid are esterified and at least one acid group is esterified with a fluoroalkyl group. In some embodiments, all of the acid groups of the α,β-unsaturated polyacid are esterified with fluoroalkyl groups.

When the PCSA is an imide, all of the acid groups of the α,β-unsaturated polyacid are imidized and at least two of the acid groups are imidized with a fluoroalkyl group. In some embodiments, all of the acid groups of the α,β-unsaturated polyacid are imidized with fluoroalkyl groups.

The PCSA may further comprise fluorinated esters or imides of an α,β-unsaturated polyacids in combination with fluorinated esters or fluorinated imides or amides of α,β-unsaturated monoacids. These esters, amides and imides can be made from the alcohols and amines described above. Examples of α,β-unsaturated monoacids include, but are not limited to acrylic acid, methacrylic acid, α-hydroxymethacrylic acid and α-chloromethacrylic acid.

The PCSA composition may further comprise adjuvants including stabilizers, flow-enhancers, plasticizers, photoinitiators, photo-radical generators and other components designed to enhance the processes described herein.

In some embodiments, the PCSA is selected from the group consisting of bis(3,3,4,4,5,5,6,6,7,7,8,8,8-tridecafluorooctyl)fumarate; bis(3,3,4,4,5,5,6,6,7,7,8,8,8-tridecafluorooctyl)maleate; bis(3,3,4,4,6,6,7,7,8,8,8-undecafluoro-5-oxa-octyl)maleate; bis(3,3,5,5,6,6,7,7,8,8,8-undecafluorooctyl)maleate; N-4,4,5,5,6,6,7,7,8,8,9,9,10,10,11,11,11-heptadecafluoroundecyl maleimide; bis(3,3,4,4,5,5,6,6,7,7,8,8,8-tridecafluorooctyl) itaconate; cis,cis-bis(3,3,4,4,5,5,6,6,7,7,8,8,8-tridecafluorooctyl)muconate; n=1-20; bis(3,3,4,4,5,5,6,6,7,7,8,8,8-tridecafluorooctyl)-hex-t-(E)-en-4-yne-1,6-dioate; bis(3,3,4,4,5,5,6,6,7,7,8,8,8-tridecafluorooctyl)acetylenedicarboxylate; bis(3,3,4,4,5,5,6,6,7,7,8,8,8-tridecafluorooctyl)-2-phenylmaleate; bis(3,3,4,4,5,5,6,6,7,7,8,8,8-tridecafluorooctyl)-2-benzylidenemalonate; bis($CH_2CH_2OCH_2CH_2OCF_2C(H)FOC_3F_7$)maleate; bis($CH_2CH_2OCF_2C(H)FOC_3F_7$)maleate; bis($CH_2CH_2CH_2OCF_2C(H)FOC_3F_7$) maleate; bis(3,3,4,4,5,5,6,6,7,7,8,8,8-tridecafluorooctyl)1-tosyloxyethylene-1,2-dicarboxylate; tetra(3,3,4,4,5,5,6,6,7,7,8,8,8-Tridecafluorooctyl)ethylenetetracarboxylate; and combinations thereof.

In some embodiments, a photoiniator is present in a separate layer in contact with the layer containing the PCSA. The photoinitiator layer may increase the speed of reaction of the PCSA and/or reduce the required dosage. In some embodiments, the photoinitiator layer is formed first and the PCSA layer is applied over and in contact with the photoinitiator layer. In some embodiments, the photoinitiator is applied over and in contact with the PCSA layer.

Photoinitiators are well known and any such material can be used so long as it interacts with the PCSA to accomplish curing and so long as it does not detrimentally affect device performance. Examples of types of photoinitators include, but are not limited to, α-hydroxyketones, phenylglyoxylates, ketals, α-aminoketones, acyl phosphines, phosphines oxides, metallocenes, and onium salts. Combinations and mixtures of photoinitiators can also be used. Two commercially available photoinitiators that are suitable for the present invention are Irgacure 184 and Darocur 1173 (commercially available from Ciba Corporation).

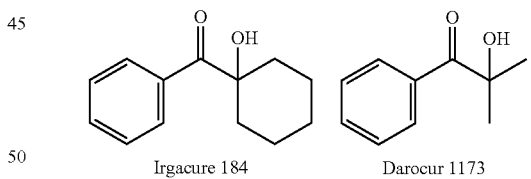

Irgacure 184          Darocur 1173

The photoinitiator layer may include other materials, such as coating aids and binders. In some embodiments, the photoinitiator layer consists essentially of photoinitiator. The photoinitiator layer can be formed by any known technique, including solution deposition, vapor deposition, and thermal transfer.

In general, PCSA materials can be made using techniques which are known in organic chemistry.

Physical differentiation between areas of the PCSA exposed to radiation and areas not exposed to radiation, hereinafter referred to as "development," can be accomplished by any known technique. Such techniques have been used extensively in the photoresist art. Examples of development techniques include, but are not limited to, application of heat and/or vacuum (evaporation), treatment with a liquid medium (washing), treatment with an absorbent material (blotting), treatment with a tacky material, and the like.

In one embodiment, the PCSA reacts with the underlying area when exposed to radiation. The exact mechanism of this reaction will depend on the materials used. In another embodiment, upon irradiation the PCSA forms a non-volatile or insoluble material that adheres to the underlying area without being chemically bonded to it. Again, the exact mechanism of this reaction will depend on the materials used. After exposure to radiation, the PCSA is removed in the unexposed areas by a suitable development treatment. In some embodiments, the PCSA is removed only in the unexposed areas. In some embodiments, the PCSA is partially removed in the exposed areas as well, leaving a thinner layer in those areas. In some embodiments, the PCSA that remains in the exposed areas is less than 50 Å in thickness. In some embodiments, the PCSA that remains in the exposed areas is essentially a monolayer in thickness.

3. Process

In the process provided herein, a first layer is formed, the first layer is treated with a photocurable surface-active composition ("PCSA"), the PCSA is exposed to radiation, the PCSA is developed to remove the PCSA from the unexposed areas, resulting in a first layer having untreated portions in the unexposed areas and treated portions in the exposed areas. The treated portions have a second surface energy that is lower than the first surface energy. A second layer is formed over and on the untreated portions of the first layer.

In one embodiment, the first layer is a substrate. The substrate can be inorganic or organic. Examples of substrates include, but are not limited to glasses, ceramics, polymeric films, such as polyester and polyimide films, metals, and metal oxides.

In one embodiment, the first layer is an electrode. The electrode can be unpatterned, or patterned. In one embodiment, the electrode is patterned in parallel lines. Alternatively, the electrodes may be a patterned array of structures having plan view shapes, such as squares, rectangles, circles, triangles, ovals, and the like. The electrode can be on a substrate.

In one embodiment, the first layer is deposited on a substrate. The first layer can be patterned or unpatterned. In one embodiment, the first layer is an organic active layer in an electronic device. In one embodiment, the organic active layer is a hole injection layer or a hole transport layer.

In one embodiment, the first layer is a photoinitiator layer. In one embodiment, the first layer is a photoinitiator layer which is over an organic active layer in an electronic device.

The first layer can be formed by any deposition technique, including vapor deposition techniques, liquid deposition techniques, and thermal transfer techniques. In one embodiment, the first layer is deposited by a liquid deposition technique, followed by drying. In this case, a first material is dissolved or dispersed in a liquid medium. The liquid deposition method may be continuous or discontinuous. Continuous liquid deposition techniques, include but are not limited to, spin coating, roll coating, curtain coating, dip coating, slot-die coating, spray coating, and continuous nozzle coating. Discontinuous liquid deposition techniques include, but are not limited to, ink jet printing, gravure printing, flexographic printing and screen printing. In one embodiment, the first layer is deposited by a continuous liquid deposition technique. The drying step can take place at room temperature or at elevated temperatures, so long as the first material and any underlying materials are not damaged.

The first layer is then treated with a PCSA. The treatment can be coincidental with or subsequent to the formation of the first layer.

In one embodiment, the PCSA treatment is coincidental with the formation of the first organic active layer. The step of treating the first layer comprises depositing the PCSA with the first layer. In one embodiment, the PCSA is added to the liquid composition used to form the first layer. When the deposited composition is dried to form a film, there is sufficient PCSA at the air interface, i.e., the top surface, of the first layer to result in a reduction in the surface energy of the system. In one embodiment, the PCSA spontaneously migrates to the upper surface of the first organic active layer.

In one embodiment, the PCSA treatment is subsequent to the formation of the first layer. In one embodiment, the PCSA is applied as a separate layer overlying, and in direct contact with, the first layer.

In one embodiment, the PCSA is applied without adding it to a solvent. In one embodiment, the PCSA is applied by vapor deposition.

In one embodiment, the PCSA is applied by a condensation process. If the PCSA is applied by condensation from the vapor phase, and the surface layer temperature is too high during vapor condensation, the PCSA can migrate into the pores or free volume of an organic substrate surface. In some embodiments, the organic substrate is maintained at a temperature below the glass transition temperature or the melting temperature of the substrate materials. The temperature can be maintained by any known techniques, such as placing the first layer on a surface which is cooled with flowing liquids or gases.

In one embodiment, the PCSA is applied to a temporary support prior to the condensation step, to form a uniform coating of PCSA. This can be accomplished by any deposition method, including liquid deposition, vapor deposition, and thermal transfer. In one embodiment, the PCSA is deposited on the temporary support by a continuous liquid deposition technique. The choice of liquid medium for depositing the PCSA will depend on the exact nature of the PCSA itself. Examples of the liquid medium include, but are not limited to, perfluorooctane, isopropanol, trifluorotoluene, 1,1,1-trichlorotrifluoroethane, and hexafluoroxylene. In one embodiment, the material is deposited by spin coating. The coated temporary support is then used as the source for heating to form the vapor for the condensation step.

Application of the PCSA can be accomplished utilizing either continuous or batch processes. For instance, in a batch process, one or more devices would be coated simultaneously with the PCSA and then exposed simultaneously to a source of radiation. In a continuous process, devices transported on a belt or other conveyer device would pass a station when they are sequentially coated with PCSA and then continue past a station where they are sequentially exposed to a source of radiation. Portions of the process may be continuous while other portions of the process may be batch.

In one embodiment, the PCSA is a liquid at room temperature and is applied by liquid deposition over the first layer. The liquid PCSA may be film-forming or it may be absorbed or adsorbed onto the surface of the first layer. In one embodiment, the liquid PCSA is cooled to a temperature below its melting point in order to form a second layer over the first layer. In one embodiment, the PCSA is not a liquid at room temperature and is heated to a temperature above its melting point, deposited on the first layer, and cooled to room temperature to form a second layer over the first layer. For the liquid deposition, any of the methods described above may be used.

In one embodiment, the PCSA is deposited from a second liquid composition. The liquid deposition method can be continuous or discontinuous, as described above. In one embodiment, the PCSA liquid composition is deposited using a continuous liquid deposition method. The choice of liquid medium for depositing the PCSA will depend on the exact nature of the PCSA material itself.

After the PCSA treatment, the PCSA is exposed to radiation. The type of radiation used will depend upon the sensitivity of the PCSA as discussed above. The exposure is patternwise. As used herein, the term "patternwise" indicates that only selected portions of a material or layer are exposed. Patternwise exposure can be achieved using any known imaging technique. In one embodiment, the pattern is achieved by exposing through a mask. In one embodiment, the pattern is achieved by exposing only select portions with a rastered laser. The time of exposure can range from seconds to minutes, depending upon the specific chemistry of the PCSA used. When lasers are used, much shorter exposure times are used for each individual area, depending upon the power of the laser. The exposure step can be carried out in air or in an inert atmosphere, depending upon the sensitivity of the materials.

In one embodiment, the radiation is selected from the group consisting of ultra-violet radiation (10-390 nm), visible radiation (390-770 nm), infrared radiation (770-$10^6$ nm), and combinations thereof, including simultaneous and serial treatments. In one embodiment, the radiation is deep UV (200-300 nm). In another embodiment, the ultraviolet radiation has a wavelength between 300 and 400 nm. In another embodiment, the radiation has a wavelength between 400 and 450 nm. In one embodiment, the radiation is thermal radiation. In one embodiment, the exposure to radiation is carried out by heating. The temperature and duration for the heating step is such that at least one physical property of the PCSA is changed, without damaging any underlying layers of the light-emitting areas. In one embodiment, the heating temperature is less than 250° C. In one embodiment, the heating temperature is less than 150° C.

In one embodiment, the radiation is ultraviolet or visible radiation. In one embodiment, the radiation is applied patternwise, resulting in exposed regions of PCSA and unexposed regions of PCSA. In one embodiment, the radiation is deep UV radiation having a wavelength of 200-300 nm. In another embodiment, the ultraviolet radiation has a wavelength between 300 and 400 nm. In another embodiment, the radiation has a wavelength between 400 and 450 nm.

After patternwise exposure to radiation, the PCSA is treated to remove the PCSA from the unexposed regions of the layer. Patternwise exposure to radiation and treatment to remove the PCSA from unexposed regions is well known in the art of photoresists.

In one embodiment, the exposure of the PCSA to radiation results in a decrease in the solubility or dispersability of the PCSA in solvents. The exposure step can be followed by a wet development treatment. The treatment usually involves washing with a solvent which dissolves, disperses or lifts off the unexposed areas of the PCSA.

In one embodiment, the exposure of the PCSA to radiation results in a reaction which decreases the volatility of the PCSA in exposed areas. After the exposure is carried out patternwise, this can be followed by a thermal development treatment to volatilize the PCSA away from the unexposed areas. The treatment involves heating to a temperature above the volatilization or sublimation temperature of the unexposed material and below the temperature at which the material is thermally curable. For example, for a polymerizable monomer, the material would be heated at a temperature above the sublimation temperature and below the thermal polymerization temperature. It will be understood that PCSA materials which have a temperature of thermal reactivity that is close to or below the volatilization temperature, may not be able to be developed in this manner.

In one embodiment, the exposure of the PCSA to radiation results in a change in the temperature at which the material melts, softens or flows. Exposure can be followed by a dry development treatment. A dry development treatment can include contacting an outermost surface of the element with an absorbent surface to absorb or wick away the softer portions. This dry development can be carried out at an elevated temperature, so long as it does not further affect the properties of the originally unexposed areas.

In one embodiment, the exposure of the PCSA to radiation results in a decrease in the volatility of the PCSA material.

After treatment with the PCSA, exposure to radiation, and development, the first layer in unexposed areas where the PCSA has been removed has a higher surface energy than the areas in which the photocured PCSA remains.

One way to determine the relative surface energies, is to compare the contact angle of a given liquid on the first organic active layer before and after treatment with the PCSA. As used herein, the term "contact angle" is intended to mean the angle $\phi$ shown in FIG. 1. For a droplet of liquid medium, angle $\phi$ is defined by the intersection of the plane of the surface and a line from the outer edge of the droplet to the surface. Furthermore, angle $\phi$ is measured after the droplet has reached an equilibrium position on the surface after being applied, i.e. "static contact angle". A variety of manufacturers make equipment capable of measuring contact angles.

In one embodiment, the photocured PCSA as described herein, has a contact angle with anisole of greater than 60°; in some embodiments, greater than 70°. In some embodiments, lower contact angles are acceptable and the contact angle with anisole is between 30° and 60°.

The second layer is then applied over and on the untreated areas of the first layer. The second layer can be applied by any deposition technique. In one embodiment, the second layer is applied by a liquid deposition technique. In this case, a liquid composition comprises a second material dissolved or dispersed in a liquid medium, applied over the untreated areas of the first layer, and dried to form the second layer. The liquid composition is chosen to have a surface energy that is greater than the surface energy of the treated areas of the first layer (the photocured PCSA), but approximately the same as or less than the surface energy of the untreated first layer. Thus, the liquid composition will wet the first layer in the unexposed areas where the PCSA has been removed by development, but will be repelled from the treated first layer in the exposed areas. The liquid may spread onto the treated first layer area, but it will de-wet.

In one embodiment, the PCSA is patterned and the second layer is applied using a continuous liquid deposition technique. In one embodiment, the second layer is applied using a discontinuous liquid deposition technique.

In one embodiment, the first layer is applied over a liquid containment structure. It may be desired to use a structure that is inadequate for complete containment, but that still allows adjustment of thickness uniformity of the printed layer. In this case it may be desirable to control wetting onto the thickness-tuning structure, providing both containment and uniformity. It is then desirable to be able to modulate the contact angle of the emissive ink. Most surface treatments used for containment (e.g., $CF_4$ plasma) do not provide this level of control.

In one embodiment, the first layer is applied over a so-called bank structure. Bank structures are typically formed from photoresists, organic materials (e.g., polyimides), or inorganic materials (oxides, nitrides, and the like). Bank structures may be used for containing the first layer in its liquid form, preventing color mixing; and/or for improving the thickness uniformity of the first layer as it is dried from its liquid form; and/or for protecting underlying features from contact by the liquid. Such underlying features can include conductive traces, gaps between conductive traces, thin film transistors, electrodes, and the like. It is often desirable to form regions on the bank structures possessing different surface energies to achieve two or more purposes (e.g., preventing color mixing and also improving thickness uniformity). One approach is to provide a bank structure with multiple layers, each layer having a different surface energy. A more cost effective way to achieve this modulation of surface energy is to control surface energy via modulation of the radiation used to cure a PCSA. This modulation of curing radiation can be in the form of energy dosage (power times exposure time), or by exposing the PCSA through a photomask pattern that simulates a different surface energy (e.g., expose through a half-tone density mask).

In one embodiment of the process provided herein, the first and second layers are organic active layers. The first organic active layer is formed over a first electrode, the first organic active layer is treated with a photocurable surface-active composition to reduce the surface energy of the layer, and the second organic active layer is formed over the treated first organic active layer.

In one embodiment, the first organic active layer is formed by liquid deposition of a liquid composition comprising the first organic active material and a liquid medium. The liquid composition is deposited over the first electrode, and then dried to form a layer. In one embodiment, the first organic active layer is formed by a continuous liquid deposition method. Such methods may result in higher yields and lower equipment costs.

In one embodiment, the PCSA is deposited from a second liquid composition. The liquid deposition method can be continuous or discontinuous, as described above. In one embodiment, the PCSA liquid composition is deposited using a continuous liquid deposition method.

When the PCSA is deposited as a separate layer, the thickness of the photocured PCSA can depend upon the ultimate end use of the material. In some embodiments, the photocured PCSA layer is less than 100 Å in thickness. In some embodiments, it is less than 10 Å in thickness. In some embodiments, the photocured PCSA layer is at least 100 Å in thickness. In some embodiments, the thickness is in the range of 100-3000 Å; in some embodiments 1000-2000 Å.

4. Organic Electronic Device

The process will be further described in terms of its application in an electronic device, although it is not limited to such application.

Figure 2:
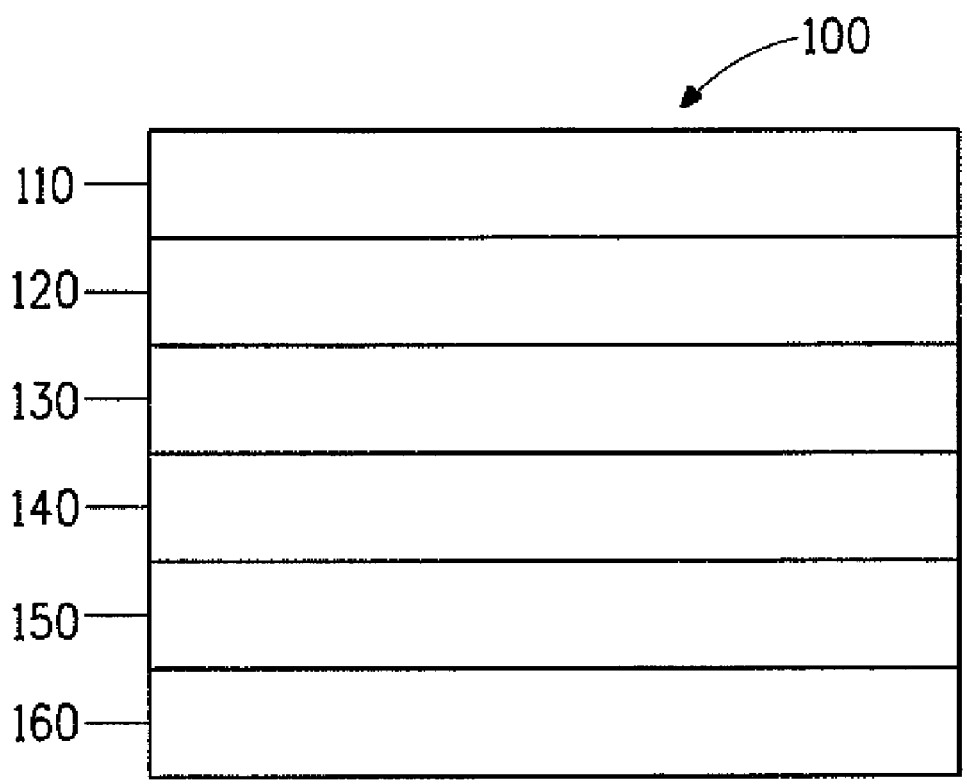
FIG. 2 includes an illustration of an organic electronic device.

FIG. 2 is an exemplary electronic device, an organic light-emitting diode (OLED) display that includes at least two organic active layers positioned between two electrical contact layers. The electronic device 100 includes one or more layers 120 and 130 to facilitate the injection of holes from the anode layer 110 into the photoactive layer 140. In general, when two layers are present, the layer 120 adjacent the anode is called the hole injection layer or buffer layer. The layer 130 adjacent to the photoactive layer is called the hole transport layer. An optional electron transport layer 150 is located between the photoactive layer 140 and a cathode layer 160. The organic layers 120 through 150 are individually and collectively referred to as the organic active layers of the device. Depending on the application of the device 100, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). The device is not limited with respect to system, driving method, and utility mode.

For multicolor devices, the photoactive layer 140 is made up different areas of at least three different colors. The areas of different color can be formed by printing the separate colored areas. Alternatively, it can be accomplished by forming an overall layer and doping different areas of the layer with emissive materials with different colors. Such a process has been described in, for example, published U.S. patent application 2004-0094768.

In one embodiment, the new process described herein can be used to apply an organic layer (second layer) to an electrode layer (first layer). In one embodiment, the first layer is the anode 110, and the second layer is the buffer layer 120.

In some embodiments, the new process described herein can be used for any successive pairs of organic layers in the device, where the second layer is to be contained in a specific area. The process for making an organic electronic device comprising a first organic active layer and a second organic active layer positioned over an electrode, comprises:

forming the first organic layer having a first surface energy over the electrode treating the first organic layer with a photocurable surface-active composition comprising a material selected from the group consisting of a fluorinated ester of an $\alpha,\beta$-unsaturated polyacid, a fluorinated imide of an $\alpha,\beta$-unsaturated polyacid, and combinations thereof;

exposing the photocurable surface-active composition patternwise with radiation resulting in exposed areas and unexposed areas;

developing the photocurable surface-active composition to remove the photocurable surface-active composition from the unexposed areas resulting in a first organic active layer having untreated portions in the unexposed areas and treated portions in the exposed areas, wherein the treated portions have a second surface energy that is lower than the first surface energy; and forming the second organic layer on the untreated portions of the first organic active layer.

In some embodiments of the new process, the first and second organic layers are organic active layers in the device. In one embodiment of the new process, the second organic layer is the photoactive layer 140, and the first organic active layer is the device layer applied just before layer 140. In many cases the device is constructed beginning with the anode layer. When the hole transport layer 130 is present, the patternwise PCSA treatment would be applied to layer 130 prior to applying the photoactive layer 140. When layer 130 was not present, the PCSA treatment would be applied to layer 120. In the case where the device was constructed beginning with the cathode, the PCSA treatment would be applied to the electron transport layer 150 prior to applying the photoactive layer 140.

In one embodiment of the new process, the first organic layer comprises a photoinitiator and the second organic layer is a photoactive layer.

In one embodiment of the new process, the second organic layer is the hole transport layer 130, and the first organic layer is the device layer applied just before layer 130. In the embodiment where the device is constructed beginning with the anode layer, the PCSA treatment would be applied to buffer layer 120 prior to applying the hole transport layer 130.

In one embodiment, the anode 110 is formed in a pattern of parallel stripes. Alternatively, the electrodes may be a patterned array of structures having plan view shapes, such as squares, rectangles, circles, triangles, ovals, and the like. The buffer layer 120 and, optionally, the hole transport layer 130 are formed as continuous layers over the anode 110. The PCSA treatment is applied to layer 130 (when present) or layer 120 (when layer 130 is not present). The PCSA is exposed in a pattern such that the areas between the anode material and the outer edges of the anode material are exposed.

The layers in the device can be made of any materials which are known to be useful in such layers. The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 160. The anode can include materials containing a metal, mixed metal, alloy, metal oxide or mixed oxide. Suitable materials include the mixed oxides of the Group 2 elements (i.e., Be, Mg, Ca, Sr, Ba), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, aluminum-zinc-oxide, gold, silver, copper, and nickel. The anode may also comprise an organic material such as polyaniline, polythiophene, or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 functions to facilitate injection of holes into the photoactive layer and to smoothen the anode surface to prevent shorts in the device. The buffer layer is typically formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer 120 can comprise charge transfer compounds, and the like, such as copper phthalocyanine and the tetrathiafulvalene-tetracyanoquinodimethane system (TTF-TCNQ). In one embodiment, the buffer layer 120 is made from a dispersion of a conducting polymer and a colloid-forming polymeric acid. Such materials have been described in, for example, published U.S. patent applications 2004-0102577 and 2004-0127637.

The buffer layer 120 can be applied by any deposition technique. In one embodiment, the buffer layer is applied by a solution deposition method, as described above. In one embodiment, the buffer layer is applied by a continuous solution deposition method.

Examples of hole transport materials for optional layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenylamino)triphenylamine (TDATA); 4,4',4''-tris(N-3-methylphenyl-N-phenylamino)triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis (9H-carbazol-9-yl)cyclobutane (DCZB); N,N,N',N'-tetrakis (4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some embodiments, the hole transport material comprises a cross-linkable oligomeric or polymeric material. After the formation of the hole transport layer, the material is treated with radiation to effect cross-linking. In some embodiments, the radiation is thermal radiation.

The hole transport layer 130 can be applied by any deposition technique. In one embodiment, the hole transport layer is applied by a solution deposition method, as described above. In one embodiment, the hole transport layer is applied by a continuous solution deposition method.

Any organic electroluminescent ("EL") material can be used in the photoactive layer 140, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The photoactive layer 140 can be applied by any deposition technique. In one embodiment, the photoactive layer is applied by a solution deposition method, as described above. In one embodiment, the photoactive layer is applied by a continuous solution deposition method.

Optional layer 150 can function both to facilitate electron injection/transport, and can also serve as a confinement layer to prevent quenching reactions at layer interfaces. More specifically, layer 150 may promote electron mobility and reduce the likelihood of a quenching reaction if layers 140 and 160 would otherwise be in direct contact. Examples of materials for optional layer 150 include, but are not limited to, metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 150 may be inorganic and comprise BaO, LiF, $Li_2O$, or the like.

The cathode 160, is an electrode that is particularly efficient for injecting electrons or negative charge carriers. The cathode layer 160 can be any metal or nonmetal having a lower work function than the first electrical contact layer (in this case, the anode layer 110). In one embodiment, the term "lower work function" is intended to mean a material having a work function no greater than about 4.4 eV. In one embodiment, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 160 include, but are not limited to, barium, lithium, cerium, cesium, europium, rubidium, yttrium, magnesium, samarium, and alloys and combinations thereof.

The cathode layer 160 is usually formed by a chemical or physical vapor deposition process.

In other embodiments, additional layer(s) may be present within organic electronic devices.

When the device is made starting with the anode side, the PCSA treatment step of the new process described herein may be after the formation of the anode 110, after the formation of the buffer layer 120, after the hole transport layer 130, or any combination thereof. When the device is made starting with the cathode side, the PCSA treatment step of the new process described herein, may be after the formation of the cathode 160, the electron transport layer 150, or any combination thereof.

The different layers may have any suitable thickness. Inorganic anode layer 110 is usually no greater than approximately 500 nm, for example, approximately 10-200 nm; buffer layer 120, and hole transport layer 130 are each usually no greater than approximately 250 nm, for example, approximately 50-200 nm; photoactive layer 140, is usually no greater than approximately 1000 nm, for example, approximately 50-80 nm; optional layer 150 is usually no greater than approximately 100 nm, for example, approximately 20-80 nm; and cathode layer 160 is usually no greater than approximately 100 nm, for example, approximately 1-50 nm. If the anode layer 110 or the cathode layer 160 needs to transmit at least some light, the thickness of such layer may not exceed approximately 100 nm.

EXAMPLES

The concepts described herein will be further described in the following examples, which do not limit the scope of the invention described in the claims.

Example 1

Example 1 demonstrates the high surface energy of an intermediate film formed from a PCSA, as described herein, on a hole transport polymer first layer.

The PCSA was bis(3,3,4,4,5,5,6,6,7,7,8,8,8-tridecafluorooctyl)fumarate ("PCSA-1"). The synthesis of this material is given in Example 12.

The hole transport polymer was a crosslinkable copolymer of triphenylamine, dioctyl fluorene, and distyryl fluorene ("HT-1").

A 30 mm glass coupon was spin coated with a 0.35 wt/vol % solution of HT-1 in toluene; the resulting film was then cured for 30 min at 275° C. A 5 wt/vol % solution PCSA-1 in perfluorooctane was then spin coated (600 rpm, 60 sec) onto the hole transport layer surface. The resulting coupon was then exposed to ultraviolet light at a wavelength of 248 nm and an exposure dose of 2.7 $J/cm^2$; it was then placed on a hot plate and baked for 120 sec at 175° C. before cooling to room temperature. The wafer surface was washed with a few milliliters of perfluorooctane and dried at room temperature. Measurement of contact angle with anisole on this surface gave a result of 65-69° advancing and 48-51° receding. When a film of HT-1 alone was washed with perfluorooctane and dried, the contact angle with anisole measured as about 15°, much lower than the PCSA-1 treated layer.

Example 2

This example shows the evaporation behavior of a PCSA as described herein compared to that of a comparative radiation-sensitive material, 3,3,4,4,5,5,6,6,7,7,8,8,9,9,10,10,11,11,12,12,12-heneicosafluorododecyl acrylate ($H_2C=CHCO_2CH_2CH_2(CF_2)_9CF_3$), ("PDEA") available from Sigma-Aldrich Co. (St. Louis, Mo.).

Samples PCSA-1 and PDEA (comparative) were placed in aluminum pans and evaporated at 25° C. in a Q600 TGA (TA Instruments, Delaware, USA). The flow rate of purge gas was 100 ml/min. The evaporation rates are shown below:

PCSA-1: 0.009 micrograms/minute

PDEA (comparative): 0.8 micrograms/minute

This shows that PCSA-1 evaporates much more slowly at ambient temperature, providing more time for processing.

Example 3

This example demonstrates treatment by a PCSA which is coincidental with the formation of the first layer.
Solution A: 100% HT-1
Solution B: 40% PCSA-1/60% HT-1
All solutions were prepared in toluene at 0.33% (weight solids/volume solvent). These solutions were spin-coated on borosilicate glass coupons to give dry coatings approximately 20 nm thick. Coupons coated with these 2 solutions were exposed to a dose of 2.7 J/cm$^2$ of ultraviolet radiation at 248 nm wavelength. The development step for the PCSA was carried out by baking the coupons at 275° C. for 30 minutes in an oven with a nitrogen atmosphere. This removes PCSA-1 in the unexposed areas, and thermally cross-links the HT-1. Contact angles were measured on the resulting films using anisole as the test fluid, with an uncertainty of +/−2 degrees:
Exposure=0 J/cm$^2$
Contact angle on film from solution A: 7 degrees
Contact angle on film from solution B: 9 degrees
Exposure ~2.7 J/cm$^2$
Contact angle on film from solution A: 8 degrees
Contact angle on film from solution B: 32 degrees
There is not a significant difference between the unexposed samples, and the film from solution A that was exposed to 2.7 J/cm$^2$. The film containing PCSA-1 had a significantly higher contact angle after exposure. This shows that adding PCSA-1 to HT-1 provides a film which undergoes a permanent change in surface energy when exposed to radiation. The PCSA can be removed in areas that are not exposed to radiation.

Example 4

This example shows the synthesis of a maleate ester of an oxo-substituted fluoroalkyl alcohol, bis(3,3,4,4,6,6,7,7,8,8,8-undecafluoro-5-oxo-octyl)maleate ("PCSA-2").

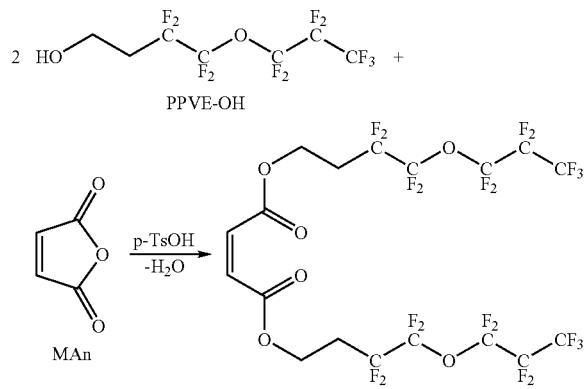

To a 250 mL 4-neck round-bottomed flask equipped with a stir bar, thermocouple, Dean-Stark trap, and condenser was added PPVE-OH (17.8 g, 0.054 mol), toluene (100 mL), MAn (2.6 g, 0.027 mol), and p-toluenesulfonic acid (0.50 g, 0.0027 mol) resulting in a colorless mixture. The mixture was heated to reflux causing the mixture to become homogeneous and heating was continued overnight. Some water was removed from the Dean Stark trap. After two days of reflux, the reaction was worked up by dilution with ethyl acetate (50 mL) and washing with saturated sodium bicarbonate in water (3×35 mL). This was followed by a wash with saturated NaCl solution in water (35 mL). The combined water washes were extracted with ethyl acetate (50 mL), and the combined organic fractions were dried over MgSO$_4$ overnight. The dried organic layer was filtered, and solvent was removed under reduced pressure at 35° C. to give an off-white oil. $^1$H, $^{13}$C, and $^{19}$F NMR indicated that the product was mostly the desired product and TGA indicated that the entire product was volatile.

Example 5

This example show the contact angle measurement of an intermediate film formed from bis(3,3,4,4,6,6,7,7,8,8,8-undecafluoro-5-oxo-octyl)maleate on a hole transport layer.

The hole transport layer was a crosslinkable copolymer of triphenylamine, dioctyl fluorene, and distyryl fluorene ("HT-1") prepared as in Example 1. A 5 wt/vol % solution of PCSA-2 from Example 4 in perfluorooctane was then spin coated (1200 rpm, 60 sec) onto the hole transport layer surface. The resulting coupon was then exposed to ultraviolet light at a wavelength of 248 nm for a period of 15 minutes resulting in an exposure dose of 1.35 J/cm$^2$. It was then placed on a hot plate and baked for 300 sec at 175° C. before cooling to room temperature. Measurement of the advancing contact angle with anisole on this surface using a Rome-Hart contact angle goniometer gave a result of 62-72°. When a film of HT-1 alone was washed with perfluorooctane and dried, the contact angle with anisole measured as about 15°, much lower than the treated layer.

Example 6

This example shows the synthesis of a maleate ester of an interrupted fluoroalkyl alcohol-bis(3,3,5,5,6,6,7,7,8,8,8-undecafluorooctyl)maleate ("PCSA-3").

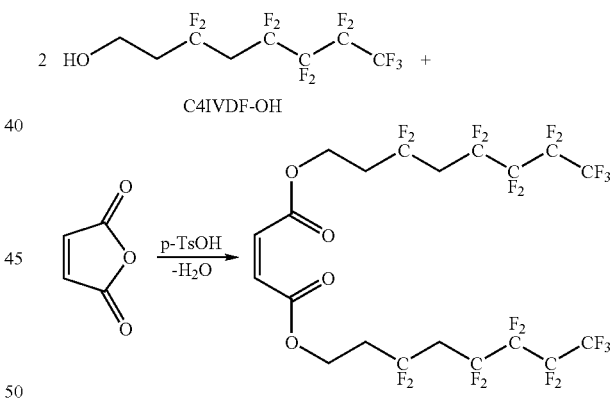

To a 250 mL 4-neck round-bottomed flask equipped with a stir bar, thermocouple, Dean-Stark trap, and condenser was added C$_4$IVDF-OH (17.8 g, 0.054 mol), toluene (100 mL), MAn (2.6 g, 0.027 mol), and p-toluenesulfonic acid (0.50 g, 0.0027 mol) resulting in a colorless mixture. The mixture was heated to reflux causing the mixture to become homogeneous and heating was continued overnight. Some water was removed from the Dean Stark trap. After two days of reflux, the reaction was worked up by dilution with ethyl acetate (50 mL) and washing with saturated sodium bicarbonate in water (3×35 mL). This was followed by a wash with saturated NaCl solution in water (35 mL). The combined water washes were extracted with ethyl acetate (50 mL), and the combined organic fractions were dried over MgSO$_4$ overnight. The dried organic layer was filtered, and solvent was removed under reduced pressure at 35° C. to give a pale yellow oil. $^1$H, $^{13}$C, and $^{19}$F NMR indicated that the product was mostly the desired product and TGA indicated that the entire product was volatile.

Example 7

This examples shows the contact angle measurement on a film formed from bis(3,3,5,5,6,6,7,7,8,8,8-undecafluorooctyl)maleate on a hole transport layer.

The hole transport layer was a crosslinkable copolymer of triphenylamine, dioctyl fluorene, and distyryl fluorene ("HT-1)" prepared as in Example 1. A 5 wt/vol % solution of PCSA-3 from Example 6 in perfluorooctane was then spin coated (1200 rpm, 60 sec) onto the hole transport layer surface. The resulting coupon was then exposed to ultraviolet light at a wavelength of 248 nm for a period of 15 minutes resulting in an exposure dose of 1.35 J/cm$^2$. It was then placed on a hot plate and baked for 300 sec at 175° C. before cooling to room temperature. Measurement of the advancing contact angle with anisole on this surface using a Rome-Hart contact angle goniometer gave a result of 31-35°. When a film of HT-1 alone was washed with perfluorooctane and dried, the contact angle with anisole measured as about 15°, much lower than the treated layer.

Example 8

This examples shows the contact angle measurement on a film formed from N-4,4,5,5,6,6,7,7,8,8,9,9,10,10,11,11,11-heptadecafluoroundecyl maleimide ("PCSA-4") on a hole transport layer. PCSA-4 was purchased from Fluka Chemical through Aldrich Chemical, St. Louis, Mo., [852527-40-3]

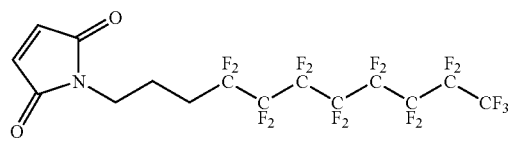

The hole transport layer was a crosslinkable copolymer of triphenylamine, dioctyl fluorene, and distyryl fluorene ("HT-1)" prepared as in Example 1. A saturated solution of PCSA-4 in isopropanol was then spin coated (600 rpm, 60 sec) onto the hole transport layer surface. The resulting coupon was then exposed to ultraviolet light at a wavelength of 248 nm for a period of 30 minutes resulting in an exposure dose of 2.7 J/cm$^2$. It was then placed on a hot plate and baked for 300 sec at 175° C. before cooling to room temperature. Measurement of the advancing contact angle with anisole on this surface using a Rome-Hart contact angle goniometer gave a result of 77-80°. When a film of HT-1 alone was washed with perfluorooctane and dried, the contact angle with anisole measured as about 15°, much lower than the treated layer.

Example 9

This examples shows the synthesis of an itaconate ester of a substituted fluoroalkyl alcohol-bis(3,3,4,4,5,5,6,6,7,7,8,8,8-tridecafluorooctyl) itaconate ("PCSA-5").

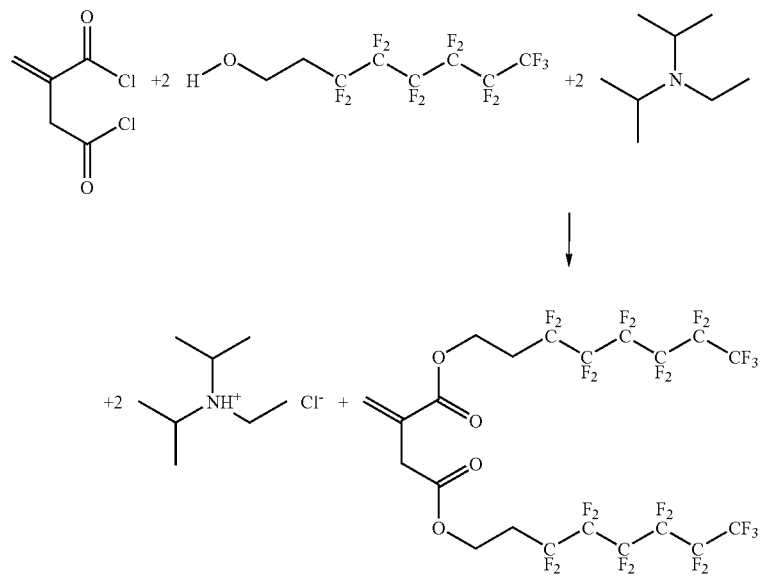

To a 1 L, 3-neck round-bottomed flask was added itaconyl chloride (19.139 g, 0.114 mol)(Aldrich), 3,3,4,4,5,5,6,6,7,7,8,8,8-tridecafluorooctanol (83.462 g, 0.229 mol), and THF (130 mL). The mixture was cooled with an ice-bath. DiPEA (29.59 g, 0.229 mol) was added dropwise through an addition funnel to the chilled solution resulting in an immediate dark-brown color. The mixture was allowed to stir overnight at room temperature. The ammonium salt was filtered off, and the filtrate was concentrated under reduced pressure to remove solvent. The dark brown product was placed in a sublimation unit and then carefully evacuated until foaming ceased. It was then sublimed at 60° C. onto a cold finger cooled with liquid nitrogen to give a white solid. The white solid collected on the cold finger was rinsed off into a vial with acetone and then dried under vacuum. The total product collected was 18.46 g or 20%. $^1$H NMR revealed desired product with very minor impurities.

Example 10

This examples shows the contact angle measurement on a film formed from bis(3,3,4,4,5,5,6,6,7,7,8,8,8-tridecafluorooctyl) itaconate on a hole transport layer.

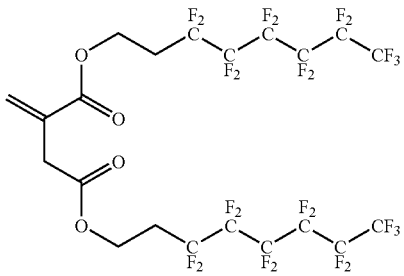

The hole transport layer was a crosslinkable copolymer of triphenylamine, dioctyl fluorene, and distyryl fluorene ("HT-1") prepared as in Example 1. Solutions (3% (wt/vol)) of both the crude PCSA-5 (in perfluorooctane) and sublimed PCSA-5 (in isopropanol) from Example 9 were prepared. The solutions were then spin coated (1200 rpm, 60 sec) onto two separate hole transport layer surfaces. The coupon bearing the crude material was then exposed to ultraviolet light with a dosage of 2.7 J/cm$^2$ at 248 nm (30 min) before baking at 65° C. for 2 min and 130° C. for 2 min. The coupon bearing the sublimed material was then exposed to ultraviolet using a 365 nm UV lamp for 60 seconds (~2.6 J/cm$^2$) before baking at 65° C. for 2 min and 130° C. for 2 min. Measurement of the advancing contact angles with anisole on these surfaces using a Rome-Hart contact angle goniometer gave a result of 45-57° for the crude product exposed with short-wavelength radiation and 28-31° for the sublimed product exposed with long-wavelength radiation. Both sets of contact angles are substantially higher than for untreated surfaces.

Example 11

This examples illustrates the synthesis of bis-(3,3,4,4,5,5,6,6,7,7,8,8,8-tridecafluorooctyl)maleate ("PCSA-6")

The 1H,1H,2H,2H-perfluoro-1-octanol (Aldrich) (36.2 grams, 99.4 mmole) was placed in a 250 ml flask under nitrogen and treated with maleic anhydride (4.06 grams, 41.4 mmole) followed by p-toluenesulfonic acid monohydrate (0.78 gram, 4.1 mmole). The mixture was stirred and heated under nitrogen to 113-115° C. to give a clear colorless liquid. The mixture was maintained at 113-115° C. for 65 minutes and then it was cooled to room temperature. The reaction mixture was chromatographed on a silica gel column (5 cm diameter and 19 cm long) using 15% ethyl acetate in hexane to give 27.07 grams (81%) of a colorless oil. The oil solidified after standing at room temperature. It was dissolved in a minimum amount (several milliliters) of ethyl acetate. The solution was diluted with approximately 40 ml of hexane to near cloud point. The solution was cooled in an ice bath and then seeded with a previously synthesized sample of the solid product. The resulting crystallized solid was filtered off, washed 3 times with hexane, air dried and then dried under high vacuum to give 18.52 grams (55% final yield) of a white solid. $^1$H NMR (CDCl$_3$): δ (ppm): 6.29 (s, 2H), 4.50 (t, 4H), 2.53 (m, 4H). $^{19}$F NMR (CDCl$_3$): δ (ppm): −81.3 (m, 6F), −114.1 (m, 4F), −122.3 (m, 4F), −123.3 (m, 4F), −124.0 (m, 4F), −126.6 (m, 4F)

Example 12

This examples shows the synthesis of bis(3,3,4,4,5,5,6,6,7,7,8,8,8-tridecafluorooctyl) fumarate ("PCSA-1")

The 1H,1H,2H,2H-perfluoro-1-octanol (Aldrich) (38.32 grams, 99.4 mmole) was placed in a 1 liter 3 neck flask under nitrogen and dissolved in 186 ml of methylene chloride. The solution was treated with triethylamine (10.66 grams, 105.3 mmole) and then cooled in an ice bath to 2° C. The solution was stirred and treated with a solution of fumaryl chloride (Aldrich) (8.05 grams, 52.6 mmole) in 42 ml of methylene chloride over a period of 10 minutes. The mixture warmed (exothermed) to 10° C. during the addition. The mixture was stirred for an additional 10 minutes in the ice bath and then it was allowed to warm to room temperature over 18 hours. The mixture was treated with water (300 ml) with stirring. The methylene chloride layer was separated, washed once with water, dried over anhydrous magnesium sulfate, filtered, and concentrated to give 38.29 grams of a brown solid. The solid was dissolved in a minimal amount of ethyl acetate and chromatographed on a silica gel column (5 cm diameter and 15 cm long) using 20% ethyl acetate in hexane to give 29.81 grams (70%) of a yellow solid. The solid was dissolved in warm toluene (25 ml) and filtered through a medium frit sintered glass funnel. The filtrate was allowed to stand at room temperature as crystals formed. The solid was filtered off, washed with toluene, washed with hexane, and air dried to give 23.15 grams of a pale yellow solid. It was recrystallized again from toluene (25 ml). The solid was filtered off, washed with toluene, washed with hexane, and air dried to give 21.24 grams of a pale yellow solid. A portion (11.36 grams) was dissolved in ethyl acetate and chromatographed on a silica gel column (5 cm diameter and 16 cm long) using 20% ethyl acetate in hexane to give 11.3 grams of a pale yellow solid. It was recrystallized from toluene (20 ml) to give 7.67 grams of a very pale yellow solid. The solid was dissolved in warm toluene (15 ml), treated with activated carbon, and filtered through a medium frit funnel. The filtrate was allowed to stand at room temperature. The resulting crystals were filtered off, washed with toluene, washed with hexane, air dried and vacuum dried to give 5.86 grams of a very slightly yellow solid. $^1$H NMR (CDCl$_3$): δ (ppm): 6.87 (s, 2H), 4.52 (t, 4H), 2.54 (m, 4H). $^{19}$F NMR (CDCl$_3$): δ (ppm): −81.3 (m, 6F), −113.9 (m, 4F), −122.3 (m, 4F), −123.3 (m, 4F), −124.0 (m, 4F), −126.6 (m, 4F)

Example 13

This example shows an alternative synthesis of PCSA-1.

The 1H,1H,2H,2H-Perfluoro-1-octanol (Aldrich) (39.82 grams, 109.4 mmole) was placed in a 1 liter 3 neck flask under nitrogen and dissolved in 190 ml of anhydrous THF. The solution was then cooled in an ice bath to 2° C. and treated with a solution of fumaryl chloride (Aldrich) (8.05 grams, 52.6 mmole) in 45 ml of anhydrous THF over a period of 5 minutes. The clear colorless solution was stirred for 10 minutes while in the ice bath. The solution was treated with diisopropylethylamine (14.7 grams, 114 mmole) over a 2 minute period to give an immediate dark brown mixture with suspended solid. The mixture warmed (exotherm) to 15° C. during the addition. The mixture then cooled to 6° C. and the ice bath was removed to warm the mixture to 23° C. The mixture was stirred for 30 minutes at 23° C. and then it was filtered through a medium frit funnel. The filtrate was concentrated to a tan solid. It was dissolved in methylene chloride, washed with water, dried over anhydrous magnesium sulfate, filtered, and concentrated to give 41.1 grams of a tan solid.

Example 14

This examples shows the synthesis of cis,cis-bis(3,3,4,4,5,5,6,6,7,7,8,8,8-tridecafluorooctyl) muconate ("PCSA-7").

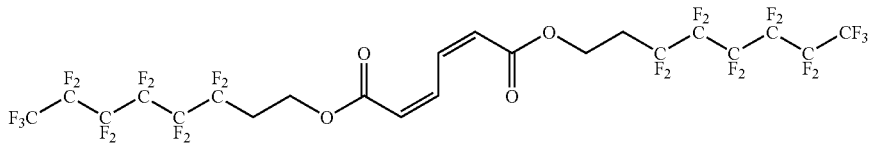

The compound, cis,cis-muconic acid (Fluka) (0.784 gram, 5.52 mmole) was suspended in 150 ml of methylene chloride under nitrogen in a 500 ml 3 neck flask. The mixture was stirred under nitrogen and cooled to 2° C. in an ice bath. The mixture was treated with oxalyl chloride (2.80 grams, 22 mmole) followed by 0.3 ml of DMF. The mixture was warmed to 20° C. and it remained a white suspension. The mixture was cooled in an ice bath and treated with additional oxalyl chloride (2.80 grams, 22 mmole). The mixture was warmed to 23° C. and it became a thinner suspension after 4 hours. It was stirred at 23° C. for 18 hours to give a clear, pale orange solution. It was concentrated and placed under high vacuum to give an orange solid. The solid was dissolved in 150 ml of methylene chloride under nitrogen, cooled in an ice bath, and treated with 1H,1H,2H,2H-perfluoro-1-octanol (Aldrich) (4.02 grams, 11.0 mmole) followed by triethylamine (4.45 grams, 44 mmole) to give a dark solution. The mixture was stirred for 20 minutes and the ice bath was removed and the mixture was warmed to 23° C. TLC showed a major UV active product after one hour at 23° C. The mixture was stirred for 68 hours at 23° C. and then it was concentrated to a tan solid. It was suspended in saturated aqueous sodium bicarbonate and extracted twice with ethyl acetate, dried over magnesium sulfate, filtered, and concentrated to give 3.78 grams of a tan solid. The solid was dissolved in ethyl acetate and chromatographed on a silica gel column (5 cm diameter by 16 cm long) using 15% ethyl acetate in hexane. The main fraction was concentrated to give 1.93 grams of an orange solid. It was recrystallized from a few ml of toluene to give 1.07 grams of a light tan solid. $^1$H NMR (CDCl$_3$): δ (ppm): 7.33 (m, 2H), 6.21 (m, 2H), 4.49 (t, 4H), 2.52 (m, 4H).

Example 15

This example shows the Contact Angle Measurement of a film formed from PCSA-6 on a hole transport layer.

The hole transport layer was a crosslinkable copolymer of triphenylamine, dioctyl fluorene, and distyryl fluorene ("HT-1)" prepared as in Example 1. The HT-1 layer was treated with a 2% (w/v) solution of the purified PCSA-6 in perfluorooctane and spin coated at 600 rpm for 60 seconds. A light film was visible under white light. The wafer was irradiated with 248 nm light at 1.5 mW/cm$^2$ for 1800 seconds (2.7 J/cm$^2$ dose). The light film was still visible. The wafer was baked at 175° C. for 300 seconds. No film was visible. Contact angle measurement using anisole gave 57-61 degrees for the advancing angle. The wafer was washed 10 times with perfluorooctane and air dried. Contact angle measurement using anisole gave 63-67° for the advancing angle.

Example 16

This example illustrates the Contact Angle Measurement of a film formed from PCSA-1 on a hole transport layer.

The hole transport layer was a crosslinkable copolymer of triphenylamine, dioctyl fluorene, and distyryl fluorene ("HT-1)" prepared as in Example 1. The HT-1 film wafer was treated with a 5% (w/v) solution of the purified PCSA-1 in perfluorooctane and spin coated at 600 rpm for 60 seconds. A light film was visible under white light. The wafer was irradiated with 248 nm light at 1.5 mW/cm$^2$ for 1800 seconds (2.7 J/cm$^2$ dose). The light film was still visible. The wafer was baked at 175° C. for 300 seconds. No film was visible. Contact angle measurement using anisole gave 57-61 degrees for the advancing angle. The wafer was washed 10 times with perfluorooctane and air dried. Contact angle measurement using anisole gave 63-67° for the advancing angle.

Example 17

This example shows the Contact Angle Measurement of a film formed from PCSA-6 on Glass.

A blank glass wafer was treated with a 2% (w/v) solution of the purified PCSA-6 in perfluorooctane and spin coated at 600 rpm for 60 seconds. A light film was visible under white light. The wafer was irradiated with 248 nm light at 1.5 mW/cm$^2$ for 1800 seconds (2.7 J/cm$^2$ dose). The light film was still visible. The wafer was baked at 175° C. for 300 seconds. No film was visible. Contact angle measurement using anisole gave 48-53° for the advancing angle and 27-35° for the receding angle.

Example 18

Control

This control shows the Contact Angle Measurement of Glass.

Contact angle measurement using anisole gave 19-22° for the advancing angle and 11-14° for the receding angle.

Example 19

This example shows the Contact Angle Measurement of a film formed from PCSA-6 on Gold.

A gold wafer was treated with a 2% (w/v) solution of the purified PCSA-6 in perfluorooctane and spin coated at 600 rpm for 60 seconds. A faint film was visible under white light. The wafer was irradiated with 248 nm light at 1.5 mW/cm$^2$ for 1800 seconds (2.7 J/cm$^2$ dose). The faint film was still visible. The wafer was baked at 175° C. for 300 seconds. No film was visible. Contact angle measurement using anisole gave 69-71 degrees for the advancing angle and 37-41° (initial sticking) for the receding angle. The wafer was washed 10 times with perfluorooctane and air dried. Contact angle measurement using anisole gave 64-65° for the advancing angle and approximately 35° (initial sticking) for the receding angle. The wafer was washed 10 times with 1,1,2-trichlorotrifluoroethane and air dried. Contact angle measurement using anisole gave 57-59° for the advancing angle and 27-34° (initial sticking) for the receding angle.

Example 20

Control

This control shows the Contact Angle Measurement of PCSA-6 on Gold without UV Irradiation.

A gold wafer was treated with a 2% (w/v) solution of the purified PCSA-6 in perfluorooctane and spin coated at 600 rpm for 60 seconds. A faint film was visible under white light. The wafer was baked at 175° C. for 300 seconds. No film was visible. Contact angle measurement using anisole gave 17-21° for the advancing angle and approximately 20° for the receding angle.

Example 21

Control

This control shows the Contact Angle Measurement of untreated Gold.

Contact angle measurement using anisole gave 5-10° for the advancing angle.

Example 22

This examples shows the Contact Angle Measurement of a film formed from PCSA-6 on a hole transport layer.

The hole transport polymer was a non-crosslinkable triarylamine polymer ("HT-2").

A 30 mm glass coupon was spin coated with a 0.35 wt/vol % solution of HT-2 in toluene. The resulting film was dried at 20° C.° for 30 minutes. The HT-2 film was treated with a 2% (w/v) solution of the purified PCSA-6 in perfluorooctane and spin coated at 600 rpm for 60 seconds. A light film was visible under white light. The wafer was irradiated with 248 nm light at 1.5 mW/cm² for 1800 seconds (2.7 J/cm² dose). The light film was still visible. The wafer was baked at 175° C. for 300 seconds. No film was visible. Contact angle measurement of HT-2 on glass using anisole gave 62-70° for the advancing angle with strong sticking and slipping.

Example 23

Control

This example shows the Contact Angle Measurement of a film formed from HT-2.

Contact angle measurement of a film formed from HT-2 on glass using anisole gave 10-13° for the advancing angle.

Example 24

This examples shows the Contact Angle Measurement of a film formed from cis,cis-bis(3,3,4,4,5,5,6,6,7,7,8,8,8-tridecafluorooctyl) muconate, PCSA-7, on a hole transport layer.

The hole transport layer was a crosslinkable copolymer of triphenylamine, dioctyl fluorene, and distyryl fluorene ("HT-1)" prepared as in Example 1. The HT-1 film was treated with a 0.5% (w/v) solution of the purified PCSA-7 in perfluorooctane and spin coated at 1200 rpm for 60 seconds. A light film was visible on the wafer. The wafer was irradiated with 365 nm light at 45 mW/cm² for 62 seconds (2.7 J/cm² dose). The light film was still visible. The wafer was baked at 175° C. for 300 seconds. No film was visible. Contact angle measurement using anisole gave 35-41° for the advancing angle. The wafer was washed 10 times with perfluorooctane and air dried. Contact angle measurement using anisole gave 35-42° for the advancing angle.

Example 25

This example shows the contact angle measurement on a film formed from a mixture of fluorinated oligomers constituting an unsaturated polyacid fluoroalkyl ester on a hole transport polymer. The example further demonstrates the removal of ungrafted material by washing rather than thermal volatilization.

The compound, 3,3,4,4,5,5,6,6,7,7,8,8,8-tridecafluorooctyl methacrylate was oligomerized using cobalt catalyzed chain transfer (Gridnev and Ittel, "Catalytic Chain Transfer in Free-Radical Polymerizations," *Chem. Rev.*, 101(12), 3611-3659 (2001).) to give a mixture of oligomers having the structure

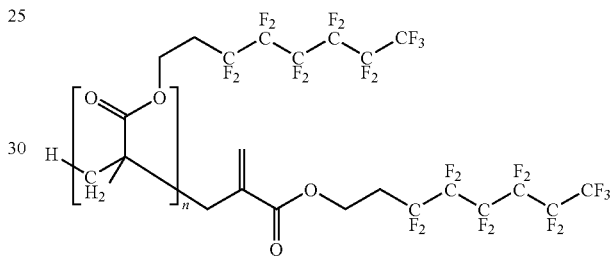

The molecular weight distribution of products was centered around trimer (n=2) but ranged as high as decamer.

The hole transport polymer was a crosslinkable copolymer of triphenylamine, dioctyl fluorene, and distyryl fluorene ("HT-1)" prepared as in Example 1. A 1 wt/vol % solution of the oligomer mixture in perfluorooctane was then spin coated (600 rpm, 60 sec) onto the hole transport layer surface of three different test coupons. One coupon was then exposed to ultraviolet light in air at a wavelength of 248 nm for a period of 15 minutes resulting in an exposure dose of 2.7 J/cm². A second coupon was exposed to ultraviolet light under nitrogen at a wavelength of 248 nm for a period of 15 minutes resulting in an exposure dose of 2.7 J/cm². The third coupon was not exposed to ultraviolet light. All three coupons were then rinsed with three 0.5 ml portions of perfluorooctane to remove any soluble material. The samples were then warmed gently for 2 min at 50° C. to remove perfluorooctane before cooling to room temperature. Measurement of the advancing contact angle with anisole on the surfaces of the three coupons using a Romé-Hart contact angle goniometer gave results of 43-44, 38-40, and 8-14°, respectively. The final value is the same as an untreated coupon, so wash-off was complete. The values for the two irradiated samples clearly indicate that material was photochemically grafted to the surface.

Example 26

Prophetic

This example demonstrates the potential synthesis of an 2,2-dimethyl-4-methylenepentanedioic acid ester of a substituted fluoroalkyl alcohol-bis(3,3,4,4,5,5,6,6,7,7,8,8,8-tridecafluorooctyl) 2,2-dimethyl-4-methylenepentanedioate

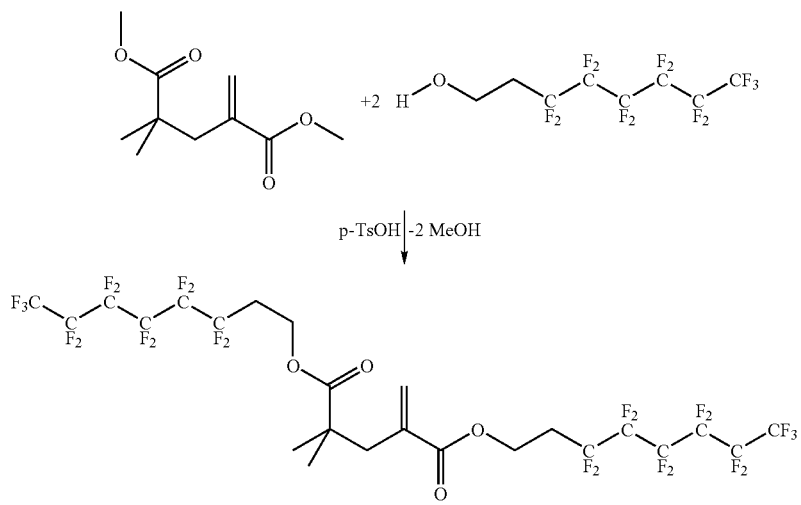

Dimethyl 2,2-dimethyl-4-methylenepentanedioate is prepared by catalytic chain transfer oligomerization of methyl methacrylate. The methanolic ester is heated with the fluoro-alcohol shown in the presence of a strong acid trans-esterification catalyst. Two equivalents of methanol are liberated yielding bis(3,3,4,4,5,5,6,6,7,7,8,8,8-tridecafluorooctyl) 2,2-dimethyl-4-methylenepentanedioate

Example 27

Prophetic

This example would demonstrate the low surface energy of a film formed from bis(3,3,4,4,5,5,6,6,7,7,8,8,8-tridecafluorooctyl) 2,2-dimethyl-4-methylenepentanedioate on a hole transport layer.

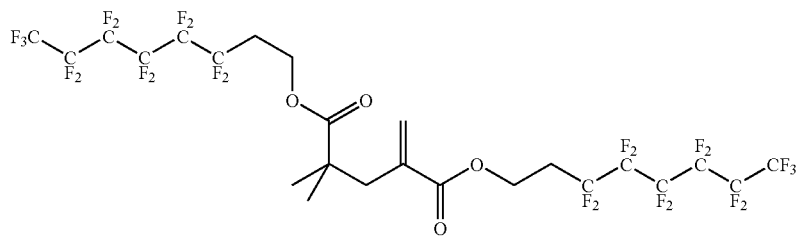

The hole transport layer is a crosslinkable copolymer of triphenylamine, dioctyl fluorene, and distyryl fluorene ("HT-1)" prepared as in Example 1. A (3% (wt/vol) solution in perfluorooctane) of the product from Example 11 is prepared. The solution is then spin coated (1200 rpm, 60 sec) onto a hole transport layer surface. The coupon is then exposed to ultraviolet light with a dosage of 2.7 J/cm$^2$ at 248 nm (30 min) before baking at 65° C. for 2 min and 130° C. for 2 min. Measurement of the advancing contact angles with anisole on these surfaces using a Romé-Hart contact angle goniometer gives a result of greater than 35°.

Example 28

This example illustrates the Contact Angle Measurement of films formed from PCSA-6 on photoinitiator layers. The hole transport layer was a crosslinkable copolymer of triphenylamine, dioctyl fluorene, and distyryl fluorene ("HT-1")." A glass wafer coated with an HT-1 film was treated with a solution of Irgacure 184 (Ciba) dissolved in Diethyl ketone (DEK) and spin coated at 600 rpm for 60 seconds. The resulting film was then treated with a 2 w/v % solution of PCSA-6 dissolved in perfluorooctane and spin coated at 600 rpm for 60 seconds. The wafer was irradiated with 248 nm light at 1.5 mW/cm$^2$, and the wafer was then baked at 175° C. for 300 seconds. Contact angles were measured using anisole. The Table below shows the measured contact angles for experiments with different exposure doses and concentrations of Irgacure 184 (some experiments where no Irgacure was applied are included for comparative purposes). It may be seen that including a photoinitiator layer substantially improves contact angle at all exposure doses, and allows one to obtain contact angles that are as high (or higher) than those obtained at higher exposure doses where no photoinitiator layer was present.

| Dose (J/cm$^2$ @ 248 nm) | Irgacure 184 Concentration in DEK (w/v %) | Advancing Contact Angle |
|---|---|---|
| 2.700 | 0.0 | 62° |
| 0.900 | 0.0 | 55 |
| 0.450 | 1.0 | 72 |
| 0.450 | 0.6 | 71 |
| 0.450 | 0.2 | 57 |
| 0.450 | 0.1 | 59 |
| 0.220 | 1.0 | 74 |
| 0.220 | 0.6 | 73 |

-continued

| Dose (J/cm² @ 248 nm) | Irgacure 184 Concentration in DEK (w/v %) | Advancing Contact Angle |
|---|---|---|
| 0.220 | 0.0 | 28 |
| 0.110 | 1.0 | 65 |
| 0.110 | 0.6 | 61 |
| 0.110 | 0.0 | 20 |
| 0.055 | 1.0 | 50 |
| 0.055 | 0.6 | 30 |
| 0.055 | 0.0 | 22 |
| 0.000 | 1.0 | 20 |
| 0.000 | 1.0 | 13 |
| 0.000 | 0.6 | 29 |
| 0.000 | 0.6 | 30 |
| 0.000 | 0.2 | 14 |
| 0.000 | 0.1 | 14 |

Example 29

This example shows the synthesis of bis(3,3,4,4,5,5,6,6,7,7,8,8,8-tridecafluorooctyl)-hex-2-(E)-en-4-yn-1,6-dioate ("PCSA-9"). The procedure used was adapted from the following reference: P. V. Ramachandran et al. Tetrahedron Letters 46 (2005) 2547-2549.

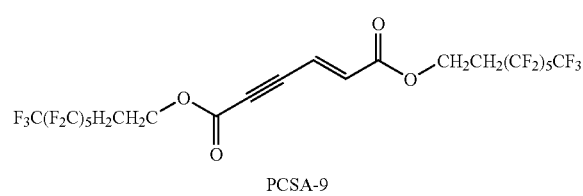

PCSA-9

1H,1H,2H,2H-perfluoro-1-octanol (10.1 g, 27.7 mmol) and propiolic acid (1.70 mL, 27.7 mmol) were dissolved in methylene chloride (15 mL), and the resulting solution cooled to 0° C. under nitrogen. To this was added a solution of dicyclohexylcarbodiimide (5.72 g, 27.7 mmol) and para-dimethylaminopyridine (0.034 g, 0.28 mmol) in methylene chloride (15 mL) over a 1 hour period, with stirring. The mixture was then allowed to warm to room temperature and a tan solid (dicyclohexylurea) precipitated. The reaction mixture was stirred overnight and then filtered to remove the dicyclohexylurea, and the filtrate was concentrated under vacuum to afford the crude product as a red oil. The crude product was chromatographed on a 15 cm×5 ccm silica gel column using 15% ethyl acetate in hexane to afford 8.31 g of (3,3,4,4,5,5,6,6,7,7,8,8,8-tridecafluorooctyl) propiolate as a yellow oil (72% yield).

The (3,3,4,4,5,5,6,6,7,7,8,8,8-tridecafluorooctyl) propiolate (2.06 g, 4.95 mmol) was dissolved in methylene chloride (5 mL) under nitrogen and cooled to 0° C. To this was added 1,4-diazabicyclo[2.2.2]octane (0.0056 g, 0.0495 mmol). The resulting dark brown solution was stirred at 0° C. for 20 min, and then concentrated to afford a tan solid. The crude product was chromatographed on a 15 cm×5 ccm silica gel column using 10% ethyl acetate in hexane to afford 1.91 g of Bis(3,3,4,4,5,5,6,6,7,7,8,8,8-Tridecafluorooctyl)-hex-2-(E)-en-4-yne-1,6-dioate ("PCSA-9") as a white solid (93% yield). $^1$H NMR (CDCl$_3$) δ 6.80 (d, 1H, CH=CH'), 6.45 (d, 1H, CH=CH'), 4.52 (mult, 4H, OCH$_2$), 2.52 (mult, 4H, OCH$_2$CH$_2$).

Example 30

This example demonstrates the shows the Contact Angle Measurement of films formed from PCSA-9 on a hole transport layer, after exposure to 248 or 365 nm light and baking. The hole transport layer was a crosslinkable copolymer of triphenylamine, dioctyl fluorene, and distyryl fluorene ("HT-1") prepared as in Example 1. A 0.25% (w/v) solution PCSA-9 in perfluorooctane was prepared. 0.0814 mL of this solution was deposited into a petri dish and the solvent allowed to evaporate. A 30 mm glass coupon coated with HT-1 (prepared as described in Example 1) was attached to the inside of the petri dish cover. The petri dish cover was placed on to the top of the petri dish, with the glass coupon facing down. An ice/brine bath was placed on top of the petri dish cover in order to cool it. The petri dish was placed on a 190° C. hot plate for 90 seconds, during which time the PCSA-9 evaporated and was vapor deposited onto the inside of the petri dish cover and the HT-1 coated glass coupon. The total amount of PCSA-9 deposited onto the HT-1 coated glass coupon was ~0.02 mg. The coupon was exposed to 248 or 365 nm light, and then baked for 5 min at 190° C. Advancing contact angles measured using anisole are summarized in the tables below:

| Dose (J/cm2) @ 248 nm | Advancing Contact Angle (deg) |
|---|---|
| 0.00 | 23 |
| 0.05 | 48 |
| 0.10 | 53 |
| 0.50 | 71 |
| 1.00 | 68 |
| 2.50 | 82 |

| Dose (J/cm2) @ 365 nm | Advancing Contact Angle (deg) |
|---|---|
| 0.0 | 17 |
| 0.1 | 23 |
| 0.3 | 24 |
| 0.5 | 36 |
| 1.0 | 42 |
| 2.0 | 50 |
| 5.0 | 71 |
| 10.0 | 70 |

Example 31

This example demonstrates the synthesis of an acetylene-derived dicarboxylate ester, bis(3,3,4,4,5,5,6,6,7,7,8,8,8-tridecafluorooctyl)acetylenedicarboxylate ("PCSA-10").

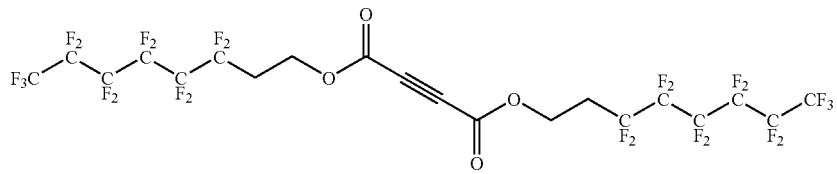

To a 3-neck 250 mL r.b. flask equipped with stir bar and gas inlet an air condenser, and an outlet under a flow of nitrogen was added 1H, 1H,2H,2H-Perfluoro-1-octanol (25.5 g, 70 mmol, DuPont), acetylenedicarboxylic acid (Aldrich, 142-45-0) (3.992 g, 35 mmol), and p-TSA (0.57 g, 3 mmol) giving a slurry. The mixture was slowly warmed to 115° C. with the solids going into solution between 100 and 110° C. to give a light yellow solution. Heating was continued at 115° C. for 24 hours. The solution was allowed to cool under flow of nitrogen and then taken up in ethyl ether (~50 mL) giving a yellow solution. The solution was washed with saturated NaHCO$_3$ solution in water (50 mL) resulting in an immediate change to a dark brown solution. The washing was repeated two additional times. The ethyl ether fraction with the product was placed over MgSO$_4$ and stirred vigorously for 15 min to dry before decantation. The solution was passed through a neutral grade alumina column (about 3 cm) resulting in a dark layer on the top of the alumina and a yellow solution. The solution was stripped to dryness yielding a light yellow tacky solid. Sublimation of the product gave a white solid.

Example 32

This example show the contact angle measurement of an intermediate film formed from bis(3,3,4,4,5,5,6,6,7,7,8,8,8-tridecafluorooctyl)acetylenedicarboxylate, PCSA-10, on a hole transport layer.

A 1% (wt/vol) solution of the acetylenedicarboxylate in perfluorooctane was prepared. The solution was spun coated onto HTL-coated wafers described in Example 5 at 600 RPM for 60 s. The wafers were immediately irradiated at 248 nm at the doses indicated in the table below. They were then baked at 175° C. for 5 min. Contact angles were then measured as described in Example 5 and the result are shown in the table below.

| UV Irradiation mJ/cm$^2$ | Contact angle range, ° (Advancing) |
|---|---|
| 0 | 23-27 |
| 32 | 37-40 |
| 60 | 43-50 |
| 112.5 | 51-56 |
| 225 | 62-67 |
| 450 | 59-65 |
| 900 | 61-67 |
| 2700 | 66-73 |

Contact angle was dose dependent, building rapidly at low exposures and approaching a maximum at longer exposures.

Example 33

This example demonstrates the synthesis of a trisubstituted olefinic dicarboxylate ester, bis(3,3,4,4,5,5,6,6,7,7,8,8,8-tridecafluorooctyl) 2-phenylmaleate ("PCSA-11").

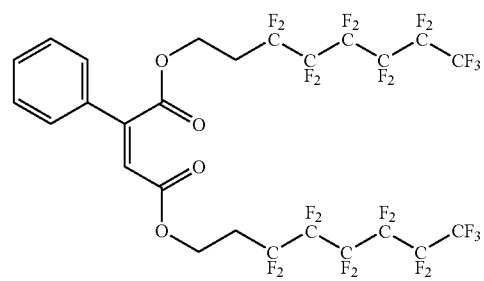

To a 3-neck 250 mL r.b. flask equipped with stir bar and gas inlet a dry condenser, and an outlet under a flow of nitrogen was added 1H,1H,2H,2H-Perfluoro-1-octanol (25.5 g, 70 mmol), phenylmaleic anhydride (Aldrich, 36122-35-7) (5.22 g, 30 mmol), and p-TSA (0.57 g, 3 mmol) giving an orangish brown slurry. The mixture was slowly warmed. Everything went into solution around 80° C. giving a red-brown clear solution. The sample was further heated to about 110° C. to give a slight reflux for one hour. Heating was increased to 150° C. and continued for 48 hours. The reaction solution was sampled for GC/MS analysis, which revealed that MAn was completely reacted but a small amount of alcohol remained. The solution was allowed to cool under flow of nitrogen and then taken up in ethyl acetate (~50 mL) giving a brown solution. The solution was washed with saturated NaHCO$_3$ solution in water (3×50 mL). The ethyl acetate fraction with the product was placed over MgSO$_4$ and stirred vigorously for 15 min to dry. The suspension was filtered and solvent was removed from filtrate under reduced pressure leaving a yellow-brown oil. The oil was taken up in a minimum of ether and then chilled overnight in dry ice. The solids were taken up in a minimum of ether and passed through an neutral grade alumina column (about 3 cm) resulting in a dark layer on the top of the alumina. The solution was tipped to dryness yielding a cream-colored crystalline solid which was bis(3,3,4,4,5,5,6,6,7,7,8,8,8-tridecafluorooctyl)2-phenylmaleate.

Example 34

This example demonstrates the vapor coating of a substrate using a trisubstituted olefin dicarboxylate.

An ice/salt water bath was prepared in a stainless steel bowl to give a temperature below 0° C. A hot plate was pre-heated to a surface temperature of 190° C. A sample (300 μL) of a solution (0.25%, w/v) of bis(3,3,4,4,5,5,6,6,7,7,8,8,8-tridecafluorooctyl)2-phenylmaleate, PCSA-11, in Vertrel®. was dispensed into the bottom of a petri dish and the Vertrel® was allowed to evaporate (1-2 minutes). The solution was dispensed in a way as to promote spreading over large area of petri dish. A single deposition substrate described in Example 5 was taped to the lid of the petri dish with Kapton® tape (acrylate adhesive). The lid was placed over the dish bottom containing the phenylmaleate. The ice/salt bath was placed onto the petri dish Assemblage for three minutes to cool the lid and substrate. The bath and petri dish were placed in the center of the hot plate for 90 sec. After cooling to room temperature, transfer of coating Material from the bottom of the petri dish to the lid and substrate could be observed. The samples were then exposed to 248 nm radiation at the doses indicated in the table below. The samples were then baked at 175° C. for 5 minutes. Contact angle measurements were then carried out and are reported in the table below.

| UV Irradiation, mJ/cm² | Average CA, ° (Advancing) |
|---|---|
| 0 | 25 |
| 450 | 44 |
| 900 | 45 |
| 2700 | 66 |

Contact angle ("CA") was dose dependent, building rapidly at low exposures and more slowly at longer exposures

Example 35

The purpose of this example is to demonstrate the synthesis of bis(3,3,4,4,5,5,6,6,7,7,8,8,8-tridecafluorooctyl)2-benzylidenemalonate ("PCSA-12") as an olefin dicarboxylate substituted in the 1,1-positions.

A 3-neck 250 mL round-bottomed flask was equipped with stir bar and gas inlet and outlet under a flow of nitrogen. To this was added C1H,1H,2H,2H-Perfluoro-1-octanol (36.4 g, 100 mmol), malonic acid (5.203 g, 50 mmol), and p-TSA (0.57 g, 3 mmol). The mixture was warmed and at about 100° C. to give a clear almost-colorless solution. The sample was heated to 115° C. for 24 hours. The solution was allowed to cool under a flow of nitrogen and then taken up in ethyl ether (~50 mL) and washed with saturated NaHCO₃ solution in water (3×50 mL). The time to get separation of the layers was quite long each time. The ether solution with product was filtered through a bed of neutral grade alumina (about 3 cm). This step lighted the color of the solution considerably and left a band of color on the alumina. The ether solution was then stripped on the rotary evaporator leaving an almost colorless liquid. The liquid was placed on the high vacuum line and the remaining ether and other volatile materials were removed from the system at room temperature. This yielded about 29 g (73%) of the desired bis(3,3,4,4,5,5,6,6,7,7,8,8,8-tridecafluorooctyl) malonate diester.

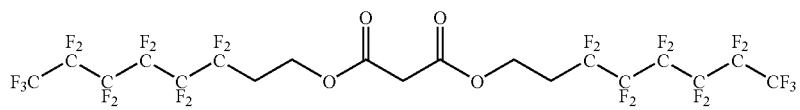

In a 100 mL 3-neck flask, 0.7146 g of piperidine (8.358 mmol) catalyst, 1.4369 g of benzaldehyde (13.543 mmol), and 10.2061 g of bis(3,3,4,4,5,5,6,6,7,7,8,8,8-tridecafluorooctyl) malonate (12.818 mmol) were stirred at room temperature. Throughout the reaction, both a solid and liquid were observed. After two hours, some of the liquid was removed mixed with acetone to obtain a GC sample that indicated a deficiency of benzaldehyde. Approximately 1 mL of additional benzaldehyde was added. After 24 hours, the reaction was stopped and solvent was removed on a rotary evaporator. The residue was dissolved in petroleum ether and cooled in dry ice overnight. The sample was then vacuum filtered to yield the desired white solid bis(3,3,4,4,5,5,6,6,7,7,8,8,8-tridecafluorooctyl)2-benzylidenemalonate.

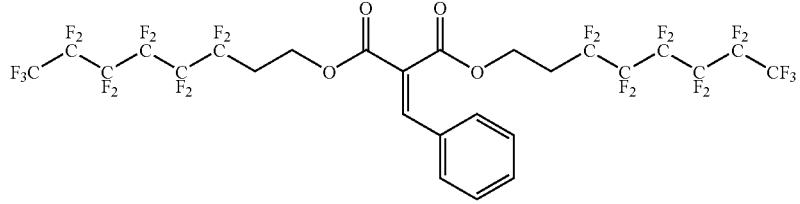

Example 36

The purpose of this example is to demonstrate the contact angle of anisole on a spun coat, UV exposed, and heat-treated film of bis(3,3,4,4,5,5,6,6,7,7,8,8,8-tridecafluorooctyl)2-benzylidenemalonate, PCSA-12.

By the method of example 5, a 1% (wt/vol) solution of bis(3,3,4,4,5,5,6,6,7,7,8,8,8-tridecafluorooctyl)2-benzylidenemalonate in Vertrel XF was spin coated on the substrate at 600 RPM for 60 s. The wafers were immediately irradiated with 248 nm radiation and baked for 5 minutes at 175° C. Contact angles were then measured.

| Irradiation dose, mJ/cm$^2$ | Contact angle range, ° (Advance) |
|---|---|
| 0 | 14-20 |
| 32 | 18-21 |
| 60 | 19-25 |
| 112.5 | 23-30 |
| 225 | 25-31 |
| 450 | 27-32 |
| 900 | 25-30 |
| 2700 | 28-35 |

The contact angle builds quickly at low doses but at high doses the ultimate contact angle is moderate.

Example 37

This example describes the synthesis of bis(3,3,4,4,5,5,6,6,7,7,8,8,8-tridecafluorooctyl)1-tosyloxyethylene-1,2-dicarboxylate (PCSA-13).

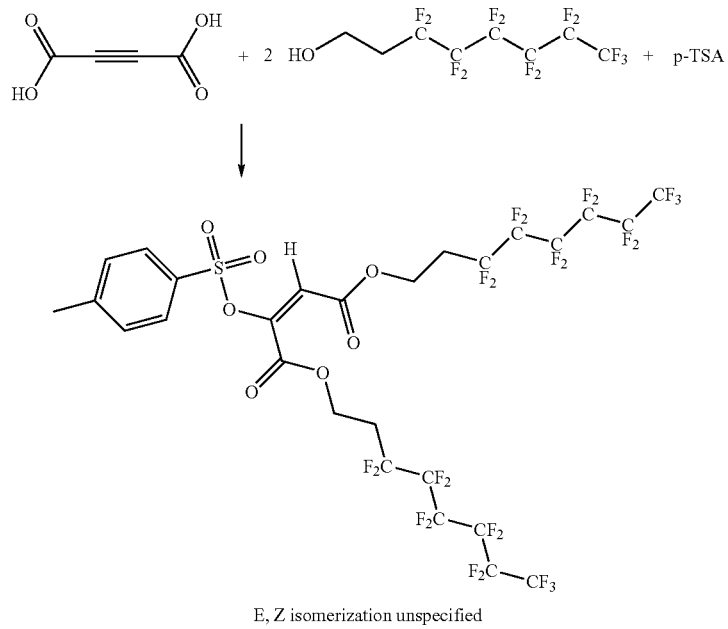

E, Z isomerization unspecified

To a 3-neck 100 mL round bottom flask equipped with a stir bar, gas inlet, dry condenser, and an outlet under a flow of nitrogen was added C6 alcohol (12.7548 g, 35.03 mmol), ADCA (2.0009 g, 17.54 mmol), and p-TSA (3.3289 g, 17.50 mmol) to initially form a pale yellow slurry mixture. As the mixture was heated to 100° C., a yellow solution formed with an oily appearance. The solution was heated at 115° C. for 24 hours. After 8 hours, the solution was a medium brown. Prior to working up the reaction, the solution was dark brown. The solution was taken up in 50 mL ethyl ether. Then, it was washed with saturated NaHCO$_3$ solution (3×-50 mL). As the NaHCO$_3$ solution was added to the mixture, the ethyl ether layer darkened in color. The ethyl ether layer was then placed over MgSO$_4$ and stirred vigorously to dry before decantation. The solution was then passed through neutral grade alumina (about 3 cm) resulting in a dark brown layer at the top of the alumina and a light-medium brown solution. The ether was then stripped to yield an orange solid. NMR spectra were obtained of the solid in chloroform. Then, the solid was recrystallized in a mixture of ethyl ether and isopropanol. After cooling the sample on dry ice, the sample was vacuum filtered to yield a pale yellow solid. This sample was placed in a kettle under the high vacuum line. The remaining liquid, which was filtered out, was placed on the rotavap to obtain a white solid. NMR spectra were obtained of both solids.

Example 38

This example describes the photografting of bis(3,3,4,4,5,5,6,6,7,7,8,8,8-tridecafluorooctyl)1-tosyloxyethylene-1,2-dicarboxylate (PCSA-13)

A 1% (wt/vol) solution of bis C6 2-(tosyloxy)maleate in Vertrel XF was spin coated on the HTL @ 600 RPM for 60 s. The wafers were immediately irradiated and baked according to the table below (At 248, 30 min=2.7 J/cm$^2$; at 365 nm, 62 sec=2.7 J/cm$^2$). Contact angles were measured using anisole and added to the wafer surface in 1 µL increments to measure advancing contact angles using the Rame-Hart goniometer. The measurements were preformed on one location on each wafer and the most consistent contact angles were recorded.

| Irradiation dose, mJ/cm$^2$ | Contact angle range, ° (Advancing) |
|---|---|
| 0 | 25-30 |
| 450 | 67-73 |
| 2700 | 80-85 |

Example 39

This example describes the synthesis of tetra(3,3,4,4,5,5,6,6,7,7,8,8,8-tridecafluorooctyl)ethylenetetracarboxylate (PCSA-14)

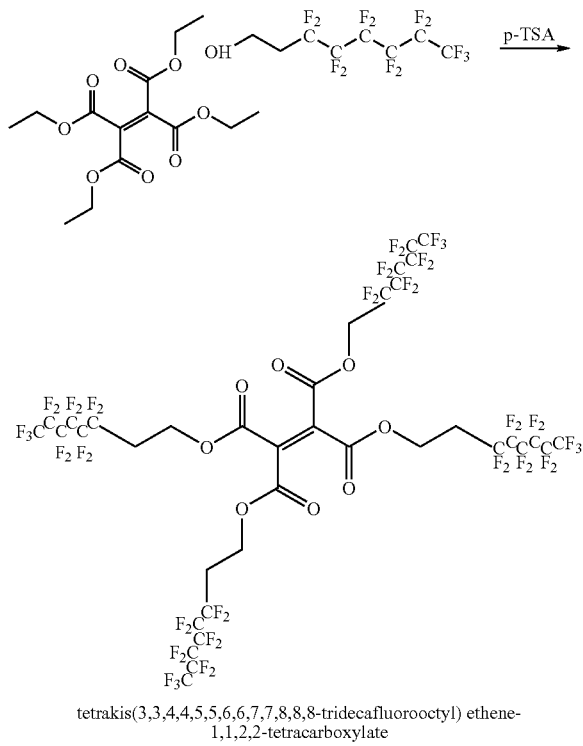

tetrakis(3,3,4,4,5,5,6,6,7,7,8,8,8-tridecafluorooctyl) ethene-1,1,2,2-tetracarboxylate Into a 3-neck round bottom flask equipped with a stir bar, nitrogen bubbler, and air condenser, 36 g (99 mmol) of 1H,1H,2H,2H-perfluorooctanol, 5 g (15.8 mmol) of tetraethyl ethylenetetracarboxylate, and 1 g of p-toluenesulfonic acid were combined. Initially, foam appeared to be present on the surface of the reaction. However, as the reaction was heated to 100° C., the foam decreased and it became evident that it was solid floating around in the liquid. As the temperature was increased, the sample became clear. After about 24 hours, the progress of the reaction was monitored using NMR, which determined that excess reactants were still present. The sample was held at temperature over a period of two weeks, with periodic additions of more 1H,1H,2H,2H-perfluorooctanol to replenish that which had been carried out of the reaction by the nitrogen flush with the liberated ethanol. After cooling, the sample was dissolved in 50 mL ether. Then it was washed with sodium bicarbonate (3×~50 mL) to yield a yellow liquid. The yellow liquid was filtered through alumina (~3 cm) was transformed into a clear liquid. The ether was stripped off on the rotavap. A white gel (taffy-like) was placed in a vial and pumped under high vacuum for a period of two days. A final NMR of the material indicated that it was mostly the desired tetra fluoroalkyl ester (4.51 ppm) that was contaminated with the tris(fluoroalkyl)monoethyl ester (4.39 for fluoroalkyl and 4.23 for ethyl ester). The ratio of 40:12:4 for these three resonances indicated a ratio of 10:4 for the two products or 28% of the monoethyltetraester

Example 40

This example describes the photografting of tetra(3,3,4,4,5,5,6,6,7,7,8,8,8-tridecafluorooctyl)ethylenetetracarboxylate (PCSA-14)

A solution (0.0832 g of solid/8.3105 g total) of tetra C6 ethylene tetracarboxylate (the material described in Example 39) in Vertrel XF was filtered and spin coated onto the HTL at 600 RPM for 60 s. The wafers were immediately irradiated and baked according to the table below. Contact angles were measured using anisole and added to the wafer surface in 1 µL increments to measure advancing contact angles using the Rame-Hart goniometer. The measurements were preformed on one location on each wafer and the most consistent contact angles were recorded.

| Irradiation dose, mJ/cm2 | Contact angle range, ° (Advancing) |
|---|---|
| 0 | 28-45 |
| 60 | 32-41 |
| 450 | 47-52 |
| 2700 | 69-75 |

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A process for forming a contained second layer over a first layer, said process comprising:
forming the first layer having a first surface energy;
treating the first layer with a photocurable surface-active composition comprising a material selected from the group consisting of a fluorinated ester of an α,β-unsaturated polyacid, a fluorinated imide of an α,β-unsaturated polyacid, and combinations thereof;
exposing the photocurable surface-active composition patternwise with radiation resulting in exposed areas and unexposed areas;
developing the photocurable surface-active composition to remove the photocurable surface-active composition from the unexposed areas resulting in a first layer having untreated portions in the unexposed areas and treated portions in the exposed areas, wherein the treated portions have a second surface energy that is lower than the first surface energy; and
forming the second layer on the untreated portions of the first layer.

2. The process of claim 1, wherein the polyacid is selected from the group consisting of fumaric acid, maleic acid, itaconic acid, 2,2-dimethyl-4-methylenepentanedioic acid, muconic acid, 2-methyleneglutaric acid, acotinic acid, acetylene dicarboxylic acid, hex-e-en-4-yne dioic acid, oligomers of methacrylic acid, and combinations thereof.

3. The process of claim 1, wherein the ester is formed using an alcohol having the formula $R_fOH$, where the carbon atom chain of the $R_f$ group has 4-15 carbon atoms, 0-5 oxo oxygen atoms contained within the carbon atom chain, and at least 4 fluorine atoms attached to the carbon atoms of the carbon atom chain, with the proviso that there is no fluorine atom on the carbon atom bearing OH.

4. The process of claim 1, wherein the imide is formed using an amine having the formula $R_fNH_2$, where the carbon atom chain of the $R_f$ group has 4-15 carbon atoms, 0-5 oxo oxygen atoms contained within the carbon atom chain, and at least 4 fluorine atoms attached to the carbon atoms of the carbon atom chain, with the proviso that there is no fluorine atom on the carbon atom bearing $NH_2$.

5. The process of claim 1, wherein the first layer is a hole transport layer.

6. The process of claim 1, wherein the photocured surface-active composition is selected from the group consisting of bis(3,3,4,4,5,5,6,6,7,7,8,8-tridecafluorooctyl)fumarate; bis(3,3,4,4,5,5,6,6,7,7,8,8-tridecafluorooctyl)maleate; bis(3,3,4,4,6,6,7,7,8,8,8-undecafluoro-5-oxa-octyl)maleate; bis(3,3,5,5,6,6,7,7,8,8,8-undecafluorooctyl)maleate; N-4,4,5,5,6,6,7,7,8,8,9,9,10,10,11,11,11-heptadecafluoroundecyl maleimide; bis(3,3,4,4,5,5,6,6,7,7,8,8-tridecafluorooctyl) itaconate; bis(3,3,4,4,5,5,6,6,7,7,8,8-tridecafluorooctyl cis, cis-muconate;

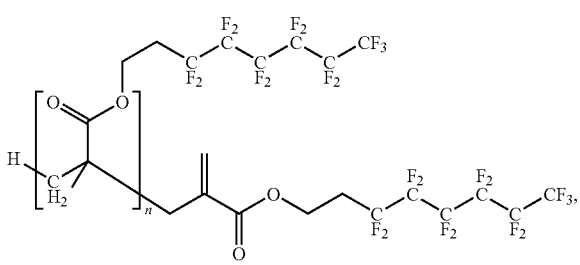

n=1-20; bis(3,3,4,4,5,5,6,6,7,7,8,8-tridecafluorooctyl)-hex-t-(E)-en-4-yne-1,6-dioate; bis(3,3,4,4,5,5,6,6,7,7,8,8-tridecafluorooctyl)acetylenedicarboxylate; bis(3,3,4,4,5,5,6,6,7,7,8,8,8-tridecafluorooctyl)-2-phenylmaleate; bis(3,3,4,4,5,5,6,6,7,7,8,8,8-tridecafluorooctyl)-2-benzylidenemalonate; bis($CH_2CH_2OCH_2CH_2OCF_2C(H)FOC_3F_7$)maleate; bis($CH_2CH_2OCF_2C(H)FOC_3F_7$)maleate; bis($CH_2CH_2CH_2OCF_2C(H)FOC_3F_7$)maleate; bis(3,3,4,4,5,5,6,6,7,7,8,8,8-tridecafluorooctyl)1-tosyloxyethylene-1,2-dicarboxylate; tetra(3,3,4,4,5,5,6,6,7,7,8,8,8-tridecafluorooctyl)ethylenetetracarboxylate; and combinations thereof.

7. The process of claim 1, wherein the first layer comprises a photoinitiator.

8. The process of claim 1, wherein the photocurable surface-active composition further comprises a photoinitiator.

9. A process for making an organic electronic device comprising a first organic layer and a second organic layer positioned over an electrode, said process comprising
forming the first organic layer having a first surface energy over the electrode
treating the first organic layer with a photocurable surface-active composition comprising a material selected from the group consisting of a fluorinated ester of an α,β-unsaturated polyacid, a fluorinated imide of an α,β-unsaturated polyacid, and combinations thereof;
exposing the photocurable surface-active composition patternwise with radiation resulting in exposed areas and unexposed areas;
developing the photocurable surface-active composition to remove the photocurable surface-active composition from the unexposed areas resulting in a first organic active layer having untreated portions in the unexposed areas and treated portions in the exposed areas, wherein the treated portions have a second surface energy that is lower than the first surface energy; and
forming the second organic layer on the untreated portions of the first organic active layer.

10. The process of claim 9, wherein the first organic layer is a hole transport layer and the second organic layer is a photoactive layer.

11. The process of claim 9, wherein the first organic layer comprises a photoinitiator and the second organic layer is a photoactive layer.

12. The process according to claim 1-9, 10 or 11 wherein the radiation is selected from the group consisting of visible radiation, ultraviolet radiation and infrared radiation, and combinations thereof including simultaneous and serial treatments.

13. The process according to claim 1-9, 10, 11 or 12 wherein treatment comprises either solution coating or vapor coating.

14. The process according to claim 1-9, 10, 11, 12 or 13 wherein the unexposed areas are removed by treating with a liquid or by evaporation.

15. An organic electronic device comprising a first organic active layer and a second organic active layer positioned over an electrode, and further comprising a patterned photocured surface-active composition, wherein said second organic active layer is present only in areas where the photocured surface-active composition is not present, and wherein said photocured surface-active composition is made from a material selected from the group consisting of a fluorinated ester of an α,β-unsaturated polyacid, a fluorinated imide of an α,β-unsaturated polyacid, and combinations thereof.

* * * * *